United States Patent
Murakami

(10) Patent No.: US 12,347,663 B2
(45) Date of Patent: Jul. 1, 2025

(54) END POINT DETECTION METHOD AND APPARATUS FOR ANISOTROPIC ETCHING USING VARIABLE ETCH GAS FLOW

(71) Applicant: SANDISK TECHNOLOGIES LLC, Addison, TX (US)

(72) Inventor: Shoichi Murakami, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 284 days.

(21) Appl. No.: 17/931,374

(22) Filed: Sep. 12, 2022

(65) Prior Publication Data

US 2024/0087860 A1    Mar. 14, 2024

(51) Int. Cl.
| | |
|---|---|
| H01J 37/32 | (2006.01) |
| H01L 21/3065 | (2006.01) |
| H01L 21/311 | (2006.01) |
| H01L 21/3213 | (2006.01) |

(52) U.S. Cl.
CPC .. *H01J 37/32963* (2013.01); *H01J 37/32449* (2013.01); *H01J 37/32935* (2013.01); *H01J 37/32972* (2013.01); *H01L 21/3065* (2013.01); *H01L 21/31116* (2013.01); *H01L 21/31144* (2013.01); *H01L 21/32134* (2013.01); *H01L 21/32139* (2013.01); *H01J 2237/3321* (2013.01); *H01J 2237/3345* (2013.01)

(58) Field of Classification Search
None
See application file for complete search history.

(56) References Cited

U.S. PATENT DOCUMENTS

| | | | |
|---|---|---|---|
| 10,283,385 B2 | 5/2019 | Watanabe et al. | |
| 11,075,218 B2 | 7/2021 | Inoue | |
| 2006/0040415 A1* | 2/2006 | Chou | H01L 21/823468 |
| | | | 257/E21.252 |
| 2015/0303069 A1* | 10/2015 | Narishige | H10B 41/27 |
| | | | 156/345.38 |
| 2020/0373323 A1 | 11/2020 | Inoue | |
| 2022/0208785 A1 | 6/2022 | Titus et al. | |

OTHER PUBLICATIONS

Endoh, T. et al., "Novel Ultra High-Density Flash Memory with A Stacked-Surrounding Gate Transistor (S-GT) Structured Cell," IEDM Proc., pp. 33-36, (2001).
U.S. Appl. No. 17/355,955, filed Jun. 23, 2021, SanDisk Technologies LLC.

(Continued)

*Primary Examiner* — Jiong-Ping Lu
(74) *Attorney, Agent, or Firm* — THE MARBURY LAW GROUP PLLC

(57) ABSTRACT

An etching method includes etching a material in an etch chamber by alternating normal-flow etch steps and reduced-flow etch steps, where an etchant gas is provided at a normal flow rate into the etch chamber during the normal-flow etch steps, and the etchant gas is provided at a reduced flow rate lower than the normal flow rate into the etch chamber during the reduced-flow etch steps, obtaining optical emission spectroscopy (OES) data during the reduced-flow etch steps, determining an end point for the etching based on the obtained OES data, and ending the etching at the determined end point.

11 Claims, 28 Drawing Sheets

(56) References Cited

OTHER PUBLICATIONS

U.S. Appl. No. 17/494,114, filed Oct. 5, 2021, SanDisk Technologies LLC.
U.S. Appl. No. 17/508,036, filed Oct. 22, 2021, SanDisk Technologies LLC.
U.S. Appl. No. 17/590,278, filed Feb. 1, 2022, SanDisk Technologies LLC.
U.S. Appl. No. 17/657,521, filed Mar. 31, 2022, SanDisk Technologies LLC.

* cited by examiner

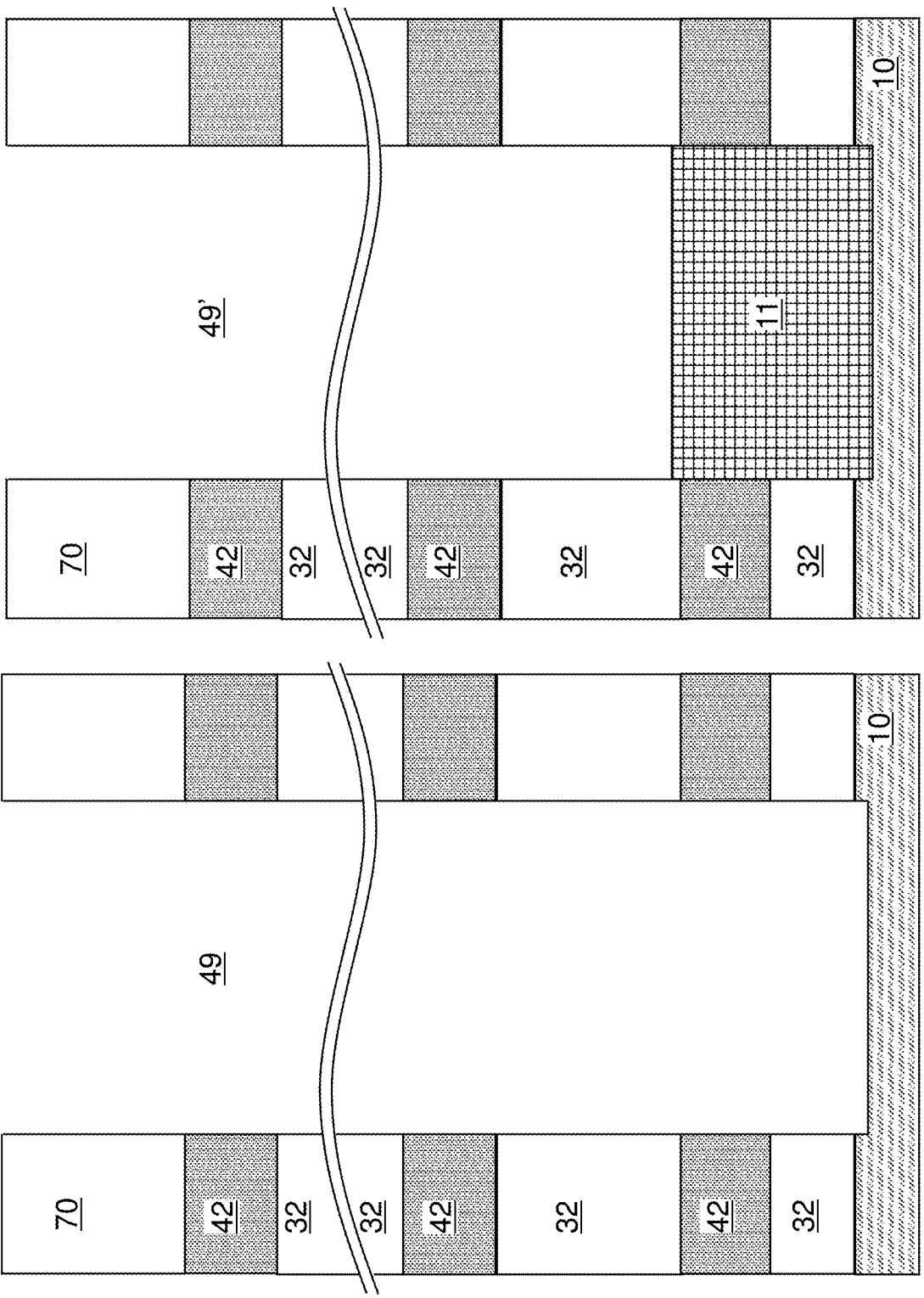

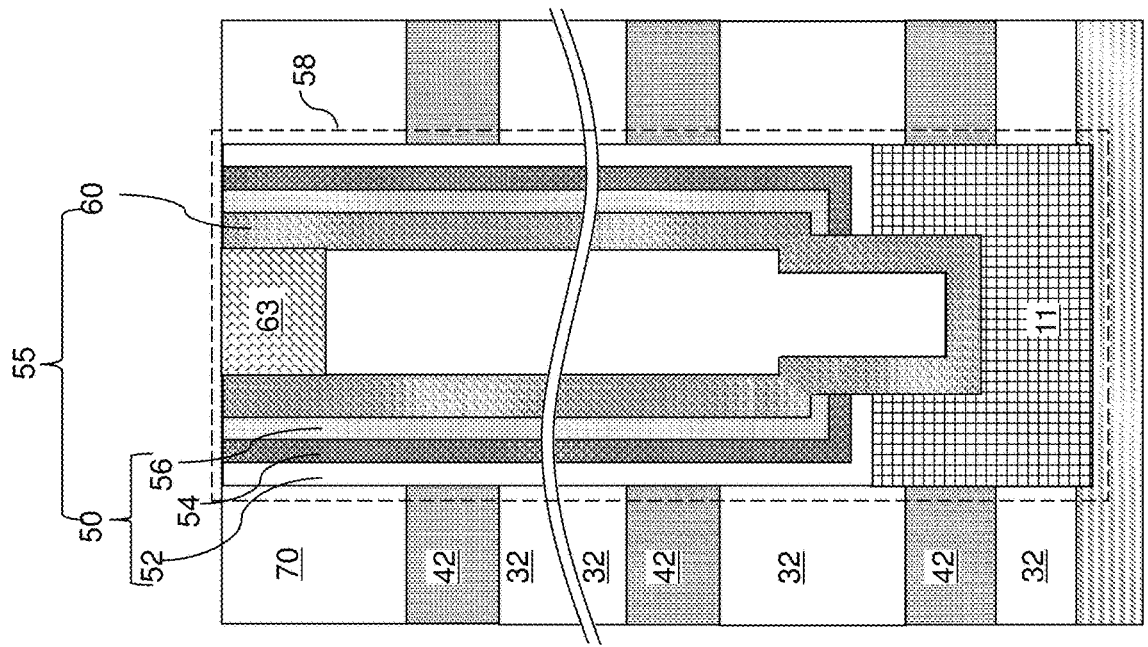
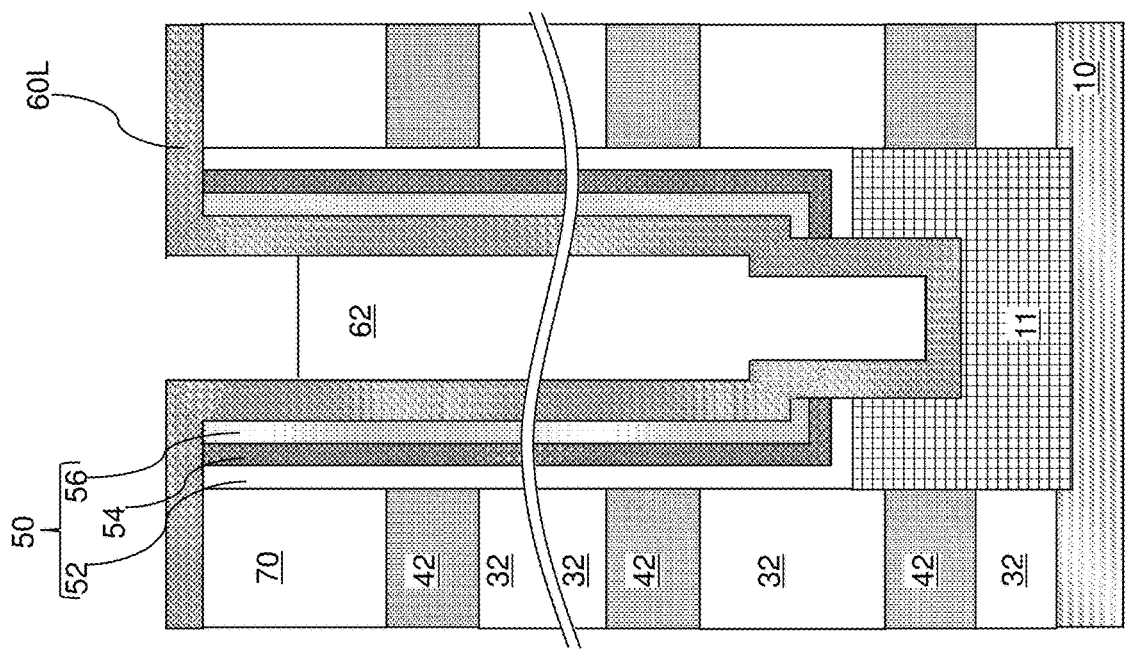

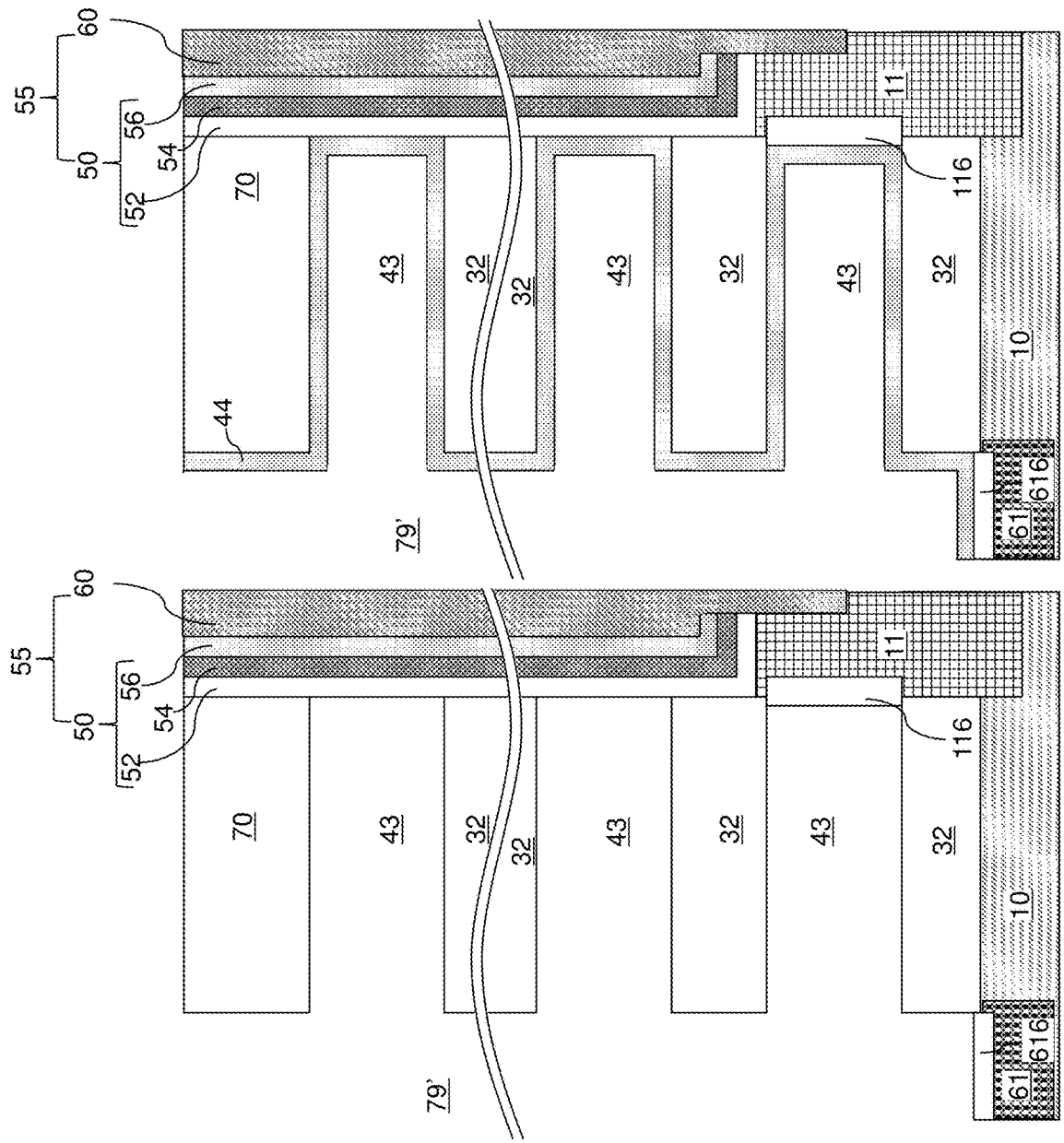

END POINT DETECTION METHOD AND APPARATUS FOR ANISOTROPIC ETCHING USING VARIABLE ETCH GAS FLOW

FIELD

The present disclosure relates generally to semiconductor manufacturing, and particularly to a method of detecting end point for an anisotropic etch process that using variable etch gas flow and an apparatus for performing the method.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, an etching method includes etching a material in an etch chamber by alternating normal-flow etch steps and reduced-flow etch steps, where an etchant gas is provided at a normal flow rate into the etch chamber during the normal-flow etch steps, and the etchant gas is provided at a reduced flow rate lower than the normal flow rate into the etch chamber during the reduced-flow etch steps, obtaining optical emission spectroscopy (OES) data during the reduced-flow etch steps, determining an end point for the etching based on the obtained OES data, and ending the etching at the determined end point.

According to another aspect of the present disclosure, an etch apparatus comprises an etch chamber comprising a vacuum enclosure and a wafer chuck located within the vacuum enclosure; a gas distribution conduit fluidly connected to the vacuum enclosure; mass flow controllers configured to control flow of an etchant gas into the gas distribution manifold; a plasma generator configured to generate a plasma of the etchant gas within the etch chamber; a spectrometer having a light-receiving aperture located outside a transparent window located in a wall of the etch chamber, and configured to measure an optical emission spectrum intensity of the plasma; and a controller. The controller is configured to flow the etchant gas into the etch chamber at a reference flow rate during each of normal-flow etch steps to etch a material located on the wafer chuck, and to flow the etchant gas into the etch chamber at a reduced flow rate lower than the normal flow rate during the reduced-flow etch steps which alternate with the normal-flow etch steps; determine an end point for the etch based on the optical emission spectrum intensity of the plasma; and end the etch at the determined end point.

BRIEF DESCRIPTION OF THE DRAWINGS

FIGS. 11A-11H are sequential schematic vertical cross-sectional views of a memory opening within the exemplary structure during formation of a memory stack structure, an optional dielectric core, and a drain region therein according to an embodiment of the present disclosure.

FIGS. 15A-15D are sequential vertical cross-sectional views of a region of the exemplary structure during formation of electrically conductive layers according to an embodiment of the present disclosure.

DETAILED DESCRIPTION

Figure 1:
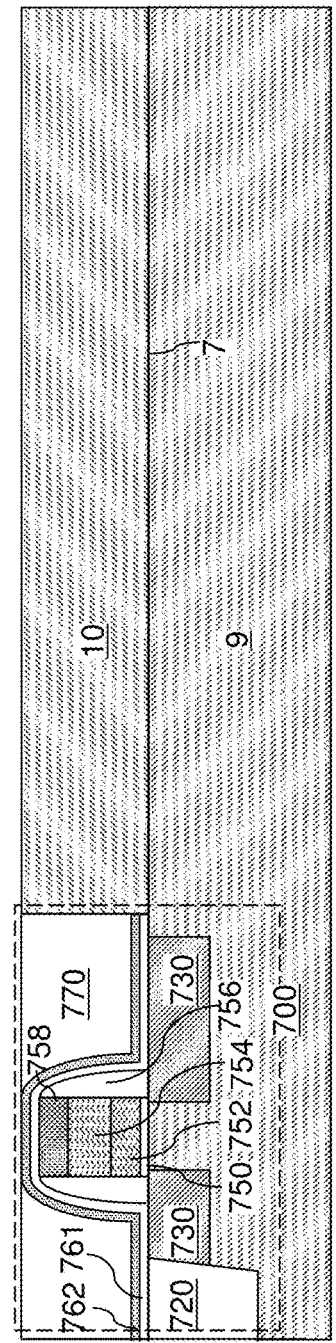
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to methods of making a three-dimensional memory device using a carbon containing mask and variable etch gas flow rate for formation of deep via openings with improved etch end point detection, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to a first embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{-5}$ S/cm. As used herein, a "semiconductor material" refers to a material having electrical conductivity in the range from $1.0 \times 10^{-6}$ S/cm to $1.0 \times 10^{-5}$ S/cm in the absence of electrical dopants therein, and is capable of producing a doped material having electrical conductivity in a range from 1.0 S/cm to $1.0 \times 10^{-5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{-5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{-5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{-5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
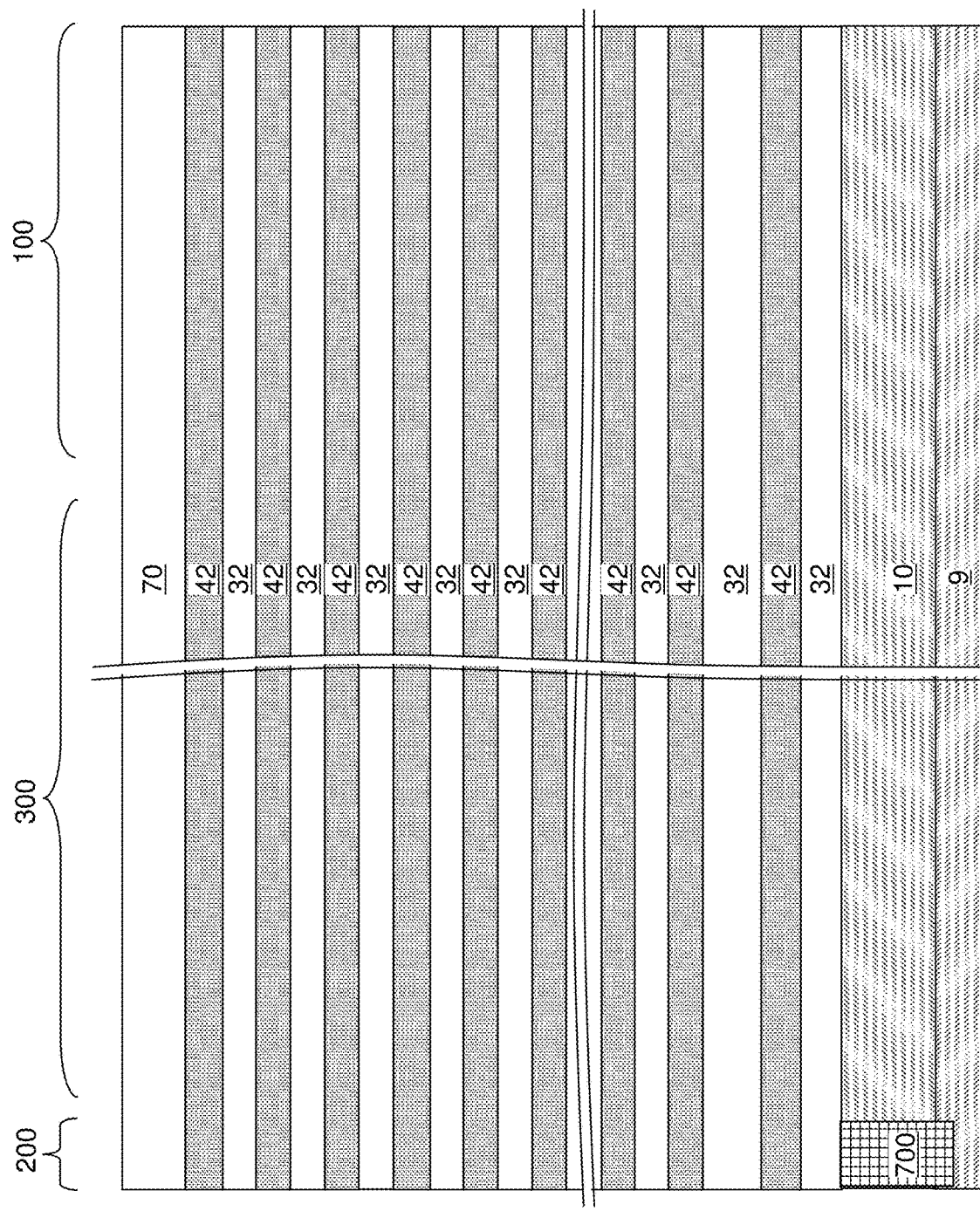
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
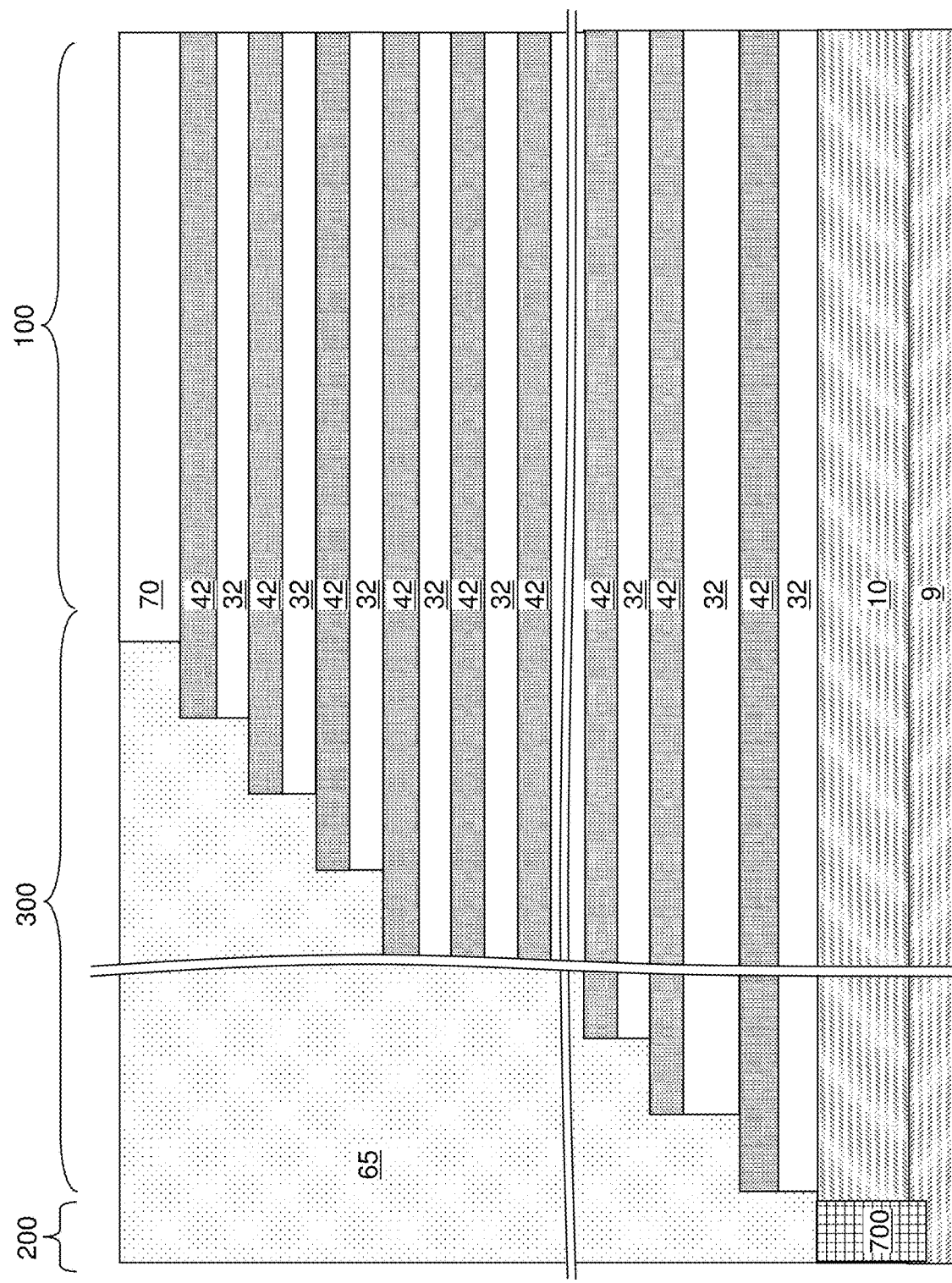
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

The thickness of the alternating stack (32, 42) increases as the total number of layers in the three-dimensional memory device increases. Correspondingly, the thickness of a carbon etch mask increases to etch deeper openings (e.g., memory openings) in the alternating stack. The increased thickness of the carbon etch mask layer reduces the etch gas plasma optical emission spectrum intensity that is used in optical emission spectroscopy ("OES") for end point detection of the etching process. The apparatus and method of the embodiments of the present disclosure use variable etch gas flow rates to provide reliable endpoint detection even when the optical emission spectrum of the plasma of the anisotropic etch process generates weak signals. Specifically, the etch gas flow rate is decreased before or during the OES measurement to increase the signal strength. The etch gas flow rate is increased after the OES measurement is complete to increase the etch rate.

Figure 4:
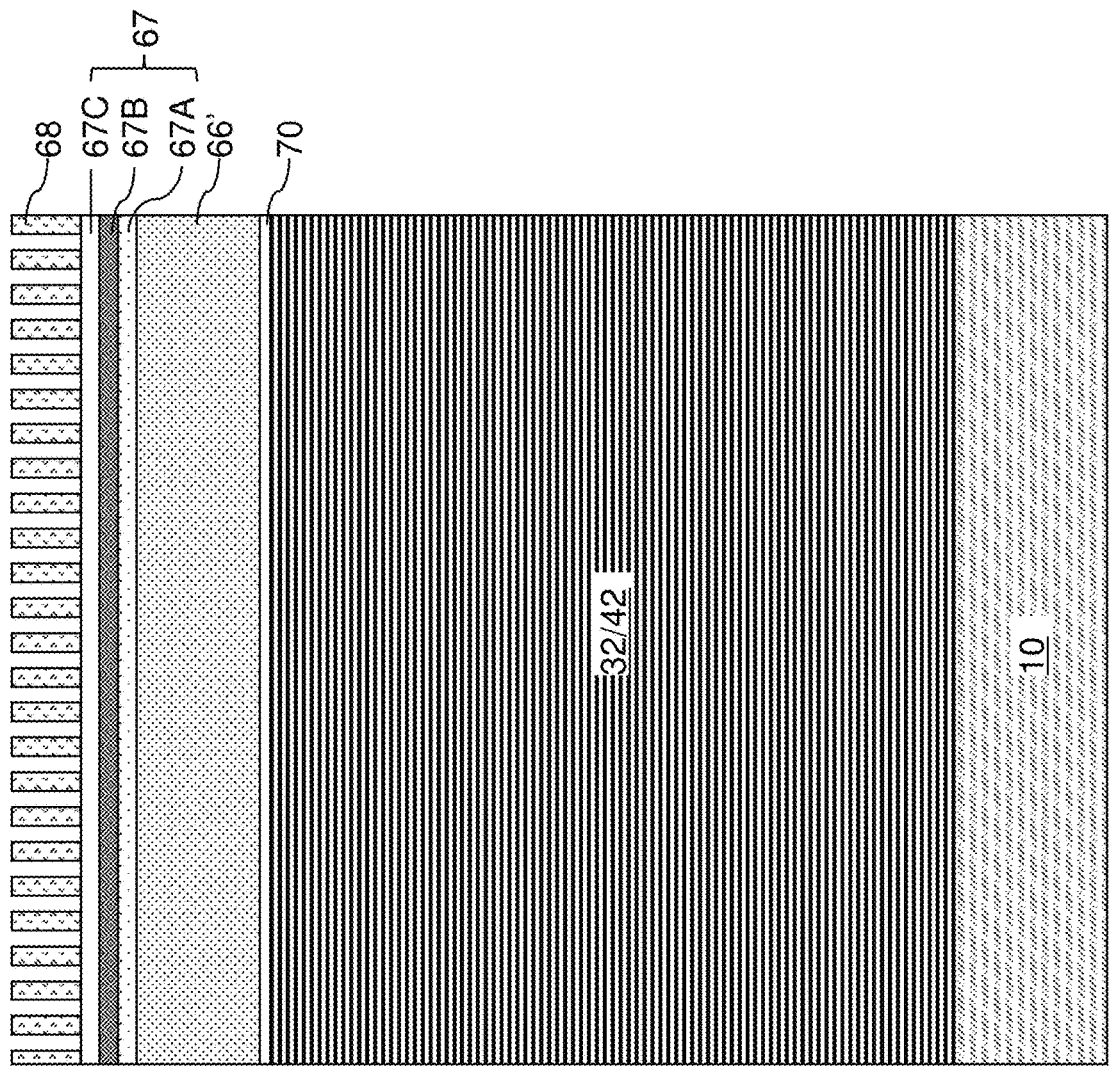
FIG. 4 is a vertical cross-sectional view of a memory array region after formation of an etch mask layer, patterning assist layers, and a patterned photoresist layer according to an embodiment of the present disclosure.

Referring to FIG. 4, a memory array region 100 of the exemplary structure is illustrated after formation of an etch mask layer 66', optional patterning assist layers 67, and a patterned photoresist layer 68. The etch mask layer 66' includes an etch mask material, which may comprise a carbon-based etch mask material, such as amorphous carbon (such as Advanced Patterning Film (APF)® etch mask available from Applied Materials, Inc.), diamond-like carbon, or a carbon-based etch mask material including carbon at an atomic percentage greater than 90%. The etch mask layer 66' is formed as an unpatterned blanket material layer, i.e., as a blanket etch mask layer having a same thickness throughout and not having any opening therethrough. The thickness of the etch mask layer 66' may be in a range from 1 micron to 6 microns, such as from 1.5 microns to 4 microns, although lesser and greater thicknesses may also be employed. The etch mask layer 66' may be formed, for example, by chemical vapor deposition. In one embodiment, the etch mask layer 66' may comprise a carbon-based material layer including carbon at an atomic percentage of at least 90% and having a thickness of at least 1.5 microns, such as 2 microns to 3.5 microns.

The patterning assist layer 67 may comprise a layer stack of various material layers that can assist formation of straight profile for sidewalls of the openings in the patterned photoresist layer 67. The patterning assist layer 67 may comprise at least one surface planarization material layer and/or at least one anti-reflection coating layer. In an illustrative example, the patterning assist layer 67 may comprise a silicon oxynitride layer 67A, a spin-on carbon layer 67B, and a spin-on glass layer 67C. For example, the silicon oxynitride layer 67A may have a thickness in a range from 100 nm to 700 nm, the spin-on carbon layer 67B may have a thickness in a range from 200 nm to 900 nm, and the spin-on glass layer 67C may have a thickness in a range from 20 nm to 90 nm, although lesser and greater thicknesses may be employed for each of the silicon oxide nitride layer 67A, the spin-on carbon layer 67B, and the spin-on glass layer 67C. In one embodiment, the patterning assist layer 67 may comprise at least one spin-on dielectric material layer (such as a spin-on carbon layer 67B and/or a spin-on glass layer 67C) each having a thickness of at least 200 nm. The various layers within the patterning assist layer 67 are optional layers that may or may not be present.

The patterned photoresist layer 68 can be formed by applying a photoresist material layer over the patterning assist layer 67, and by lithographically exposing and developing the photoresist material layer. The pattern of the openings in the patterned photoresist layer 68 includes a pattern of memory openings to be subsequently formed in the memory array region 100 and a pattern of support openings to be subsequently formed in the contact region 300.

Generally, a blanket etch mask layer 66', an optional patterning assist layer 67, and a patterned photoresist layer 68 may be formed over at least one material layer (such as an alternating stack of insulating layers 32 and spacer material layers) overlying a substate 9 that may include a semiconductor material layer 10. In one embodiment, the alternating stack of insulating material layers 32 and spacer material layers (such as the sacrificial material layers 42) may have a total thickness of at least 4 microns.

Figure 5:
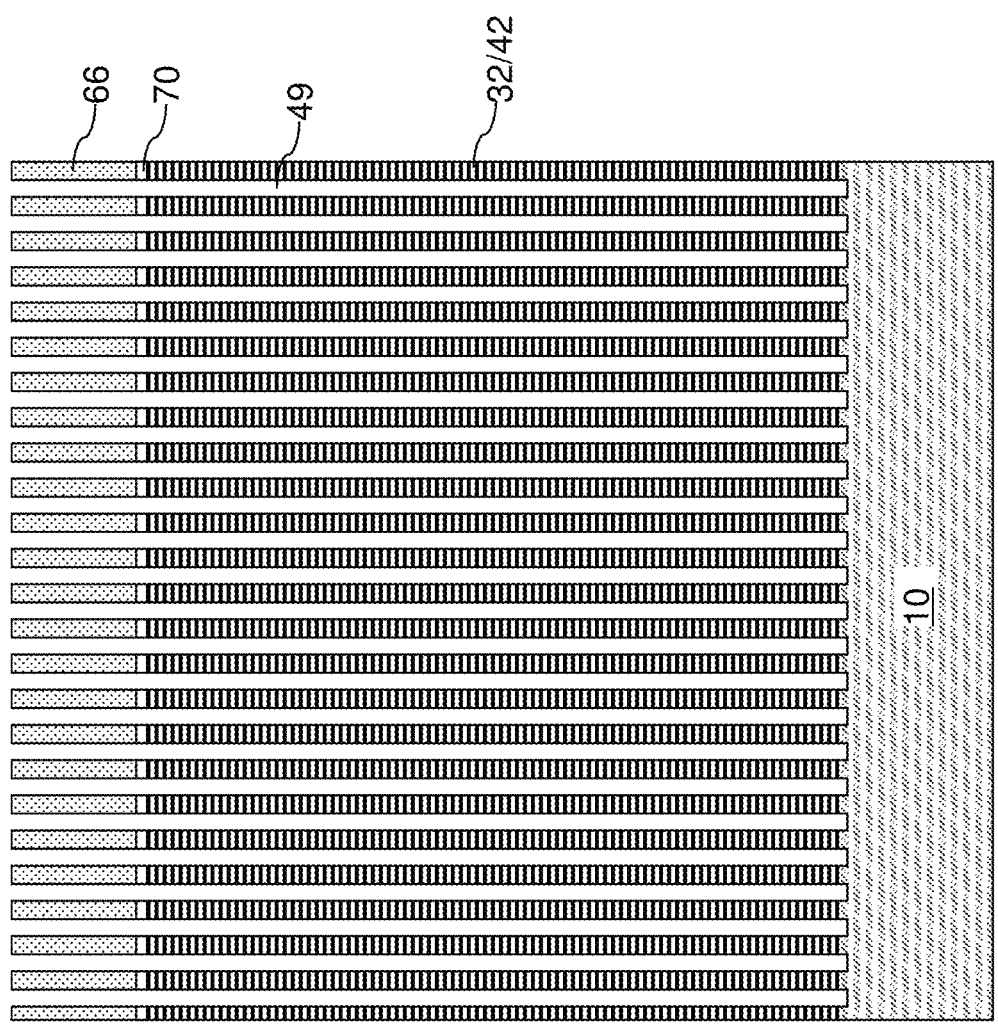
FIG. 5 is a vertical cross-sectional view of a memory array region after formation of memory openings according to an embodiment of the present disclosure.

Referring to FIG. 5, the stack including the substrate (10), the at least one material layer (such as the alternating stack of insulating layers 32 and sacrificial material layers 42), the blanket etch mask layer 66', the optional patterning assist layer 67, and the patterned photoresist layer 68 can be loaded in an etch chamber of an etch apparatus. The pattern in the patterned photoresist layer 68 can be transferred through the optional patterning assist layer 67 and the blanket etch mask layer 66' by performing a first anisotropic etch process. The patterning assist layer 67 and the blanket etch mask layer 66' may be patterned with the pattern of the openings in the patterned photoresist layer 68. The patterning assist layer 67 becomes a patterned patterning assist layer, and the blanket etch mask layer becomes a patterned etch mask layer 66. In one embodiment, the patterned photoresist layer 68 may be collaterally removed during transfer of the pattern into the patterned etch mask layer 66. In other words, the patterned photoresist layer 68 may be consumed during transfer of the pattern through the blanket etch mask layer.

A second anisotropic etch process can be performed to etch unmasked portions of the at least one material layer (such as the alternating stack of insulating layers 32 and sacrificial material layers 42) that are located within the areas of the openings in the patterned etch mask layer 66. The patterned patterning assist layer may be collaterally removed during the second anisotropic etch process. Further, an upper portion of the patterned etch mask layer 66 can be collaterally removed during the second anisotropic etch process. In one embodiment, the depth of the openings that are formed in the at least one material layer (such as the alternating stack of insulating layers 32 and sacrificial material layers 42) is controlled such that depth of the bottom surfaces of the openings below the horizontal plane including the bottommost surface of the at least one material layer is within a predetermined limit. The openings that are formed through the alternating stack (32, 42) may comprise memory openings 49 and support openings (not illustrated). Remaining portions of the patterned etch mask layer 66 can be subsequently removed, for example, by ashing.

For example, the first and/or second anisotropic etch processes may be reactive ion etch processes that are conducted using different etch gases with end point detection and are terminated upon detection of endpoint signals. The endpoint signals may comprise optical signals that indicate the presence of the next material in the stack being etched. For example, the end of the first anisotropic etch process which etches the carbon patterned etch mask layer 66 and the start of the second anisotropic etch process of the silicon oxide layers 32 and silicon the nitride layers 42 of the alternating stack (32, 42) may provide an optical endpoint signal which corresponds to the presence of silicon etch by-product which is detected by OES. By employing an endpoint detection, the etching can be controlled with higher reliability.

Figure 6:
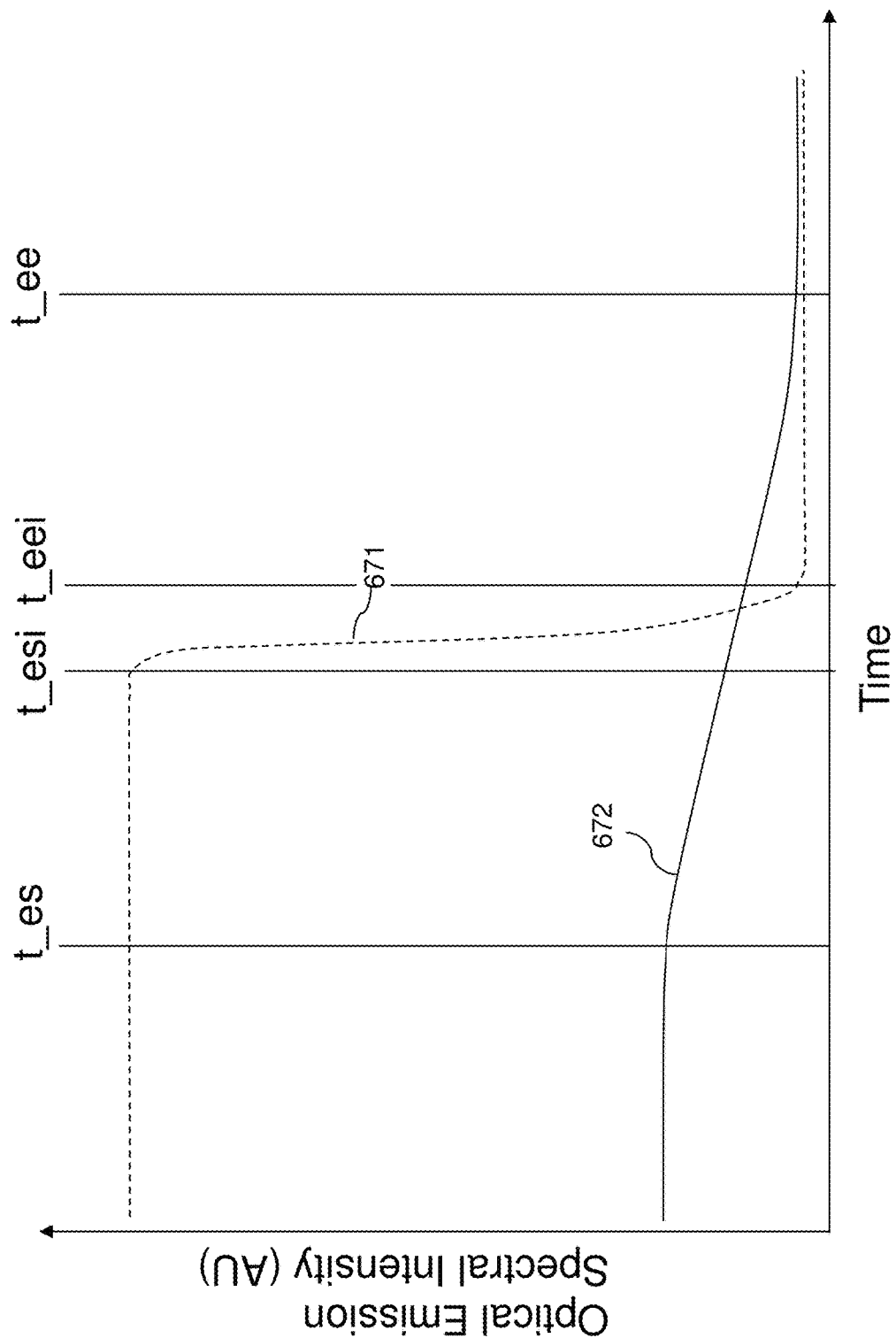
FIG. 6 is a schematic representation of optical emission spectral intensity as a function of time for relatively thin and thick etch mask layers.

Referring to FIG. 6, a first curve 671 and a second curve 672 are illustrated to illustrate the nature of the challenges that embodiments of the present disclosure address. The first curve 671 schematically illustrates an ideal optical emission spectral intensity as a function of time during an anisotropic etch process that etches a relatively thin etch mask layer consisting essentially of carbon overlying an alternating stack of silicon oxide layers and silicon nitride layers. The second curve 672 schematically illustrates a non-ideal optical emission spectral intensity as a function of time during an anisotropic etch process that etches a high aspect ratio opening through a relatively thick etch mask layer consisting essentially of carbon overlying an alternating stack of silicon oxide layers and silicon nitride layers The first curve 671 exhibits a strong signal intensity and a pronounced decrease in the optical emission spectral intensity at a wavelength that corresponds to the emission wavelength of etch byproducts of silicon oxide and silicon nitride at an endpoint start indication time t_esi, and stabilization of the lower magnitude of the optical emission spectral intensity at an endpoint ending indication time t_eei. The endpoint start indication time t_esi corresponds to a time during a reactive ion etch process at which a top surface of a silicon containing layer is initially physically exposed. The endpoint ending indication time t_eei corresponds to a time during the reactive ion etch process at which an increase in the physically exposed areas of the silicon layer saturates, i.e., do not increase any more over time. An ideal termination time located between points t_esi and t_eei for the reactive ion etch process that exhibits the first curve 671 as a function of the optical emission spectral intensity can be easily determined based on measured values for the endpoint start indication time t_esi and the endpoint ending indication time t_eei.

The second curve 672 exhibits a reduced magnitude for the optical emission spectral intensity prior to onset of any endpoint signal. The reduced magnitude of the optical emission spectral intensity is believed to be due to the increase in the thickness of the etch mask layer. Specifically, a smaller fraction of plasma that reacts at the bottom of openings through the etch mask layer can escape through the openings in the etch mask layer due to an increase in the aspect ratio of the openings (e.g., due to the increased mask thickness) that are formed during the reactive ion etch process. Further, the interaction between the plasma and the various materials on the sidewalls of the openings has the effect of gradually reducing the optical emission spectral intensity and blurs endpoint signals. While estimation of an endpoint start time t_es and an endpoint ending time t_ee is possible, determination of such endpoint start time t_es and such an endpoint ending time t_ee is generally difficult due to the low signal intensity, width distance between these times, and a relatively gentle slope of the OES intensity signal as a function of time. Further, calculation of an ideal termination time for the reactive ion etch process from such low signal intensity is difficult. Thus, the increase in the thickness of at least one material layer through which openings are formed, and the corresponding increase in the thickness of an etch mask layer makes it difficult to determine an ideal termination time for an anisotropic etch process if the depth of the openings through the at least one material layer is to be precisely controlled.

Embodiments of the present disclosure employ an etch method and apparatus configured to determine a termination time for an anisotropic etch process (such as a reactive ion etch process) by using a modulated (i.e., variable) etch gas flow during the anisotropic etch process. The etch gas flow rate is reduced before or during the OES measurement, and is increased after the OES measurement.

Figure 7:
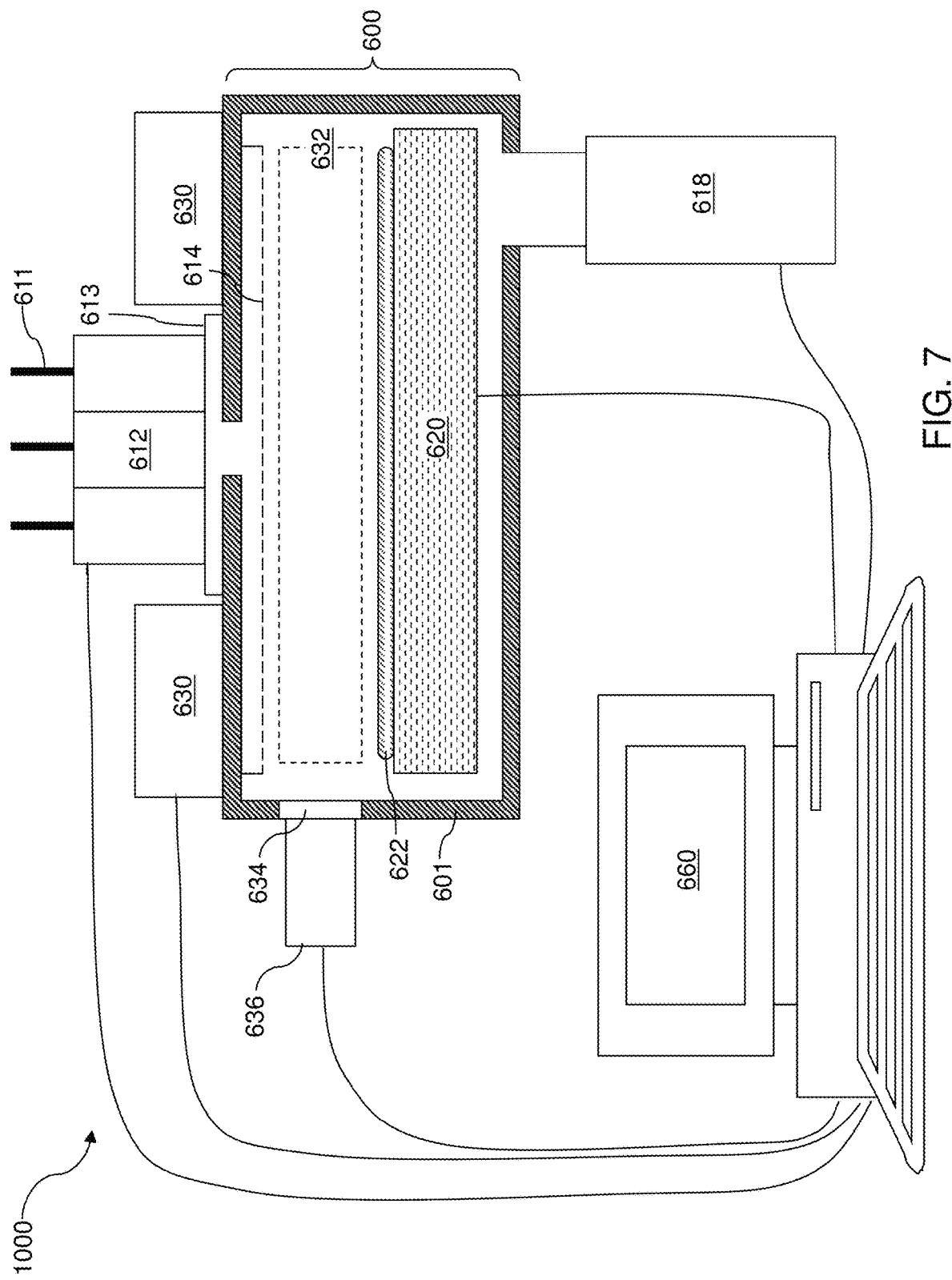
FIG. 7 is a schematic view of an etch apparatus according to an embodiment of the present disclosure.

Referring to FIG. 7, an etch apparatus 1000 according to an embodiment of the present disclosure is illustrated. The etch apparatus 1000 comprises an etch chamber 600 comprising a vacuum enclosure 601 and a wafer chuck 620 located within the vacuum enclosure 601; a gas distribution conduit (e.g., manifold) 613 connected to the vacuum enclosure 601; mass flow controllers 612 attached to and overlying the gas distribution manifold 613 and configured to control flow of an etchant (i.e., etch) gas into the gas distribution manifold 613; a plasma generator 630 configured to generate a plasma 632 of the etchant gas within a volume between the top portion of the etch chamber 600 and the wafer chuck 620; and a spectrometer 636 having a light-receiving aperture that points toward the plasma 632 through a transparent window 634 located in a wall (e.g., a sidewall) of the etch chamber 600. The spectrometer 636 is located outside the vacuum enclosure 601 on the outside of the window 634 and is configured to measure an optical emission spectrum intensity of the plasma 632.

The plasma generator 630 may be a radio-frequency (RF) plasma generator or any other suitable plasma generator. In one embodiment, a showerhead plate 614 may be provided inside the vacuum enclosure 601 at an interface between the gas distribution manifold 613 and a volume of the vacuum enclosure 601 employed to form the plasma 632. Mass flow controllers 612 and gas supply lines 611 may be connected to the gas distribution manifold 613. According to an aspect of the present disclosure, the gas distribution manifold 613 and the mass flow controllers 612 may be attached to the top surface of the etch chamber 600 to minimize the time delay between changes in the gas flow rate through the mass flow controllers 612 and the rate of gas influx into the vacuum enclosure 601. In one embodiment, the gas distribution manifold 613 is attached to a top portion of the etch chamber 600, and the mass flow controllers 612 are attached to and overlie the gas distribution manifold 613. Alternatively, the gas distribution manifold 613 and/or the mass flow controllers 612 may be attached to another surface rather than the top surface of the etch chamber 600.

The wafer chuck 620 may be any type of vacuum chuck know in the art. For example, the wafer chuck 620 may be an electrostatic chuck. A wafer 622 can be loaded onto the wafer chuck 620. Generally, the wafer 622 includes a substrate 9 (e.g., silicon wafer), at least one material layer (which may comprise an alternating stack of insulating layers 32 and sacrificial material layers 42), a blanket etch mask layer 66', and a patterned photoresist layer 68 as shown in FIG. 4. A vacuum pump 618 is fluidly connected to the volume within the vacuum enclosure 601 through a vacuum port and a vacuum valve (not illustrated).

In one embodiment, the etch apparatus 1000 comprises a controller 660, such as a computer, which runs a process control program for performing an anisotropic etch process. The anisotropic etch process is performed within the etch apparatus 1000 by flowing an etchant gas into the vacuum enclosure 601. The flow of the etchant gas can be controlled by one of the mass flow controllers 612. The anisotropic etch process may employ additional process gases that are controlled by a respective one of the mass flow controllers 612. The controller 660 is connected to the mass flow controllers 612 via wired or wireless data connection(s) to control the flow of the etchant gas into the vacuum chamber 601. The controller 660 may also connected to the spectrometer 636 via wired or wireless data connection(s) to control the operation of the spectrometer 636, to obtain OES data from the spectrometer 636 and to end the etching process based on the obtained OES data. The controller may also be connected to the vacuum pump 616, the chuck 620 and/or the plasma generator 630 via wired or wireless data connection (s) to control their operation.

Figure 8:
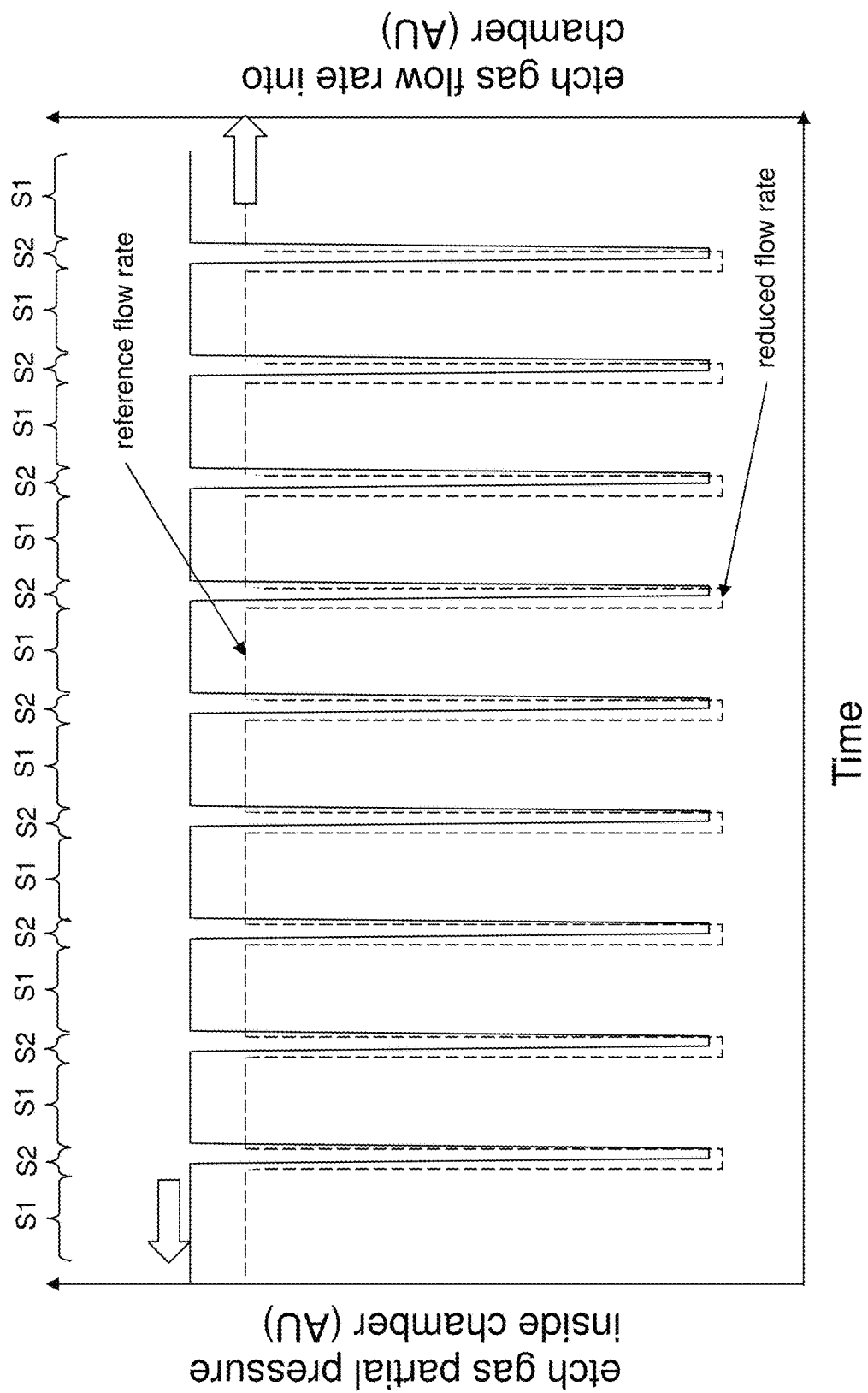
FIG. 8 is a diagram illustrating the etchant gas partial pressure and the etchant gas flow rate during an anisotropic etch process according to an embodiment of the present disclosure.

Referring to FIG. 8, the partial pressure inside the vacuum enclosure 601 and flow rate of the etchant gas (i.e., etch gas) into the vacuum enclosure 601 are illustrated as a function of time during the anisotropic etch process. According to an aspect of the present disclosure, the anisotropic etch process comprises normal-flow etch steps S1 that are temporally interlaced with reduced-flow etch steps S2. In one embodiment, controller 660 may be configured to flow the etchant gas into the etch chamber 600 at a reference flow rate during each of the normal-flow etch steps S1, and to flow the etchant gas into the etch chamber 600 at a reduced flow rate during the reduced-flow etch steps S2. In one embodiment, the reduced flow rate, is in a range from 5% to 50% of the reference flow rate. In one embodiment, each duration of the reduced-flow etch steps S2 is in a range from 1% to 25% of an average duration of the normal-flow etch steps S1 other than a last normal-flow etch step.

In one embodiment, the optical emission spectrum intensity of the plasma 632 can be measured using the spectrometer 636 during the reduced-flow etch steps S2. According to an aspect of the present disclosure, the etchant gas, the reference flow rate, and the reduced flow rate are selected such that the optical emission spectrum intensity of the plasma 632 increases during the reduced-flow etch steps S2 relative to the normal-flow etch steps S1. Thus, the reduction in the amount (i.e., partial pressure) of the etchant gas in the vacuum chamber 601 during the reduced-flow etch steps S2 increases the OES signal strength and quality. In other words, the OES measurement is performed during the reduced-flow etch steps S2 and is not performed during the normal-flow etch steps S1. Thus, the etch rate is reduced only during the relatively short reduced-flow etch steps S2 but not during the relatively long normal-flow etch steps S1. Therefore, the overall etch rate remains relatively high while an improved OES signal may be obtained during the relatively short reduced-flow etch steps S2

Figure 9:
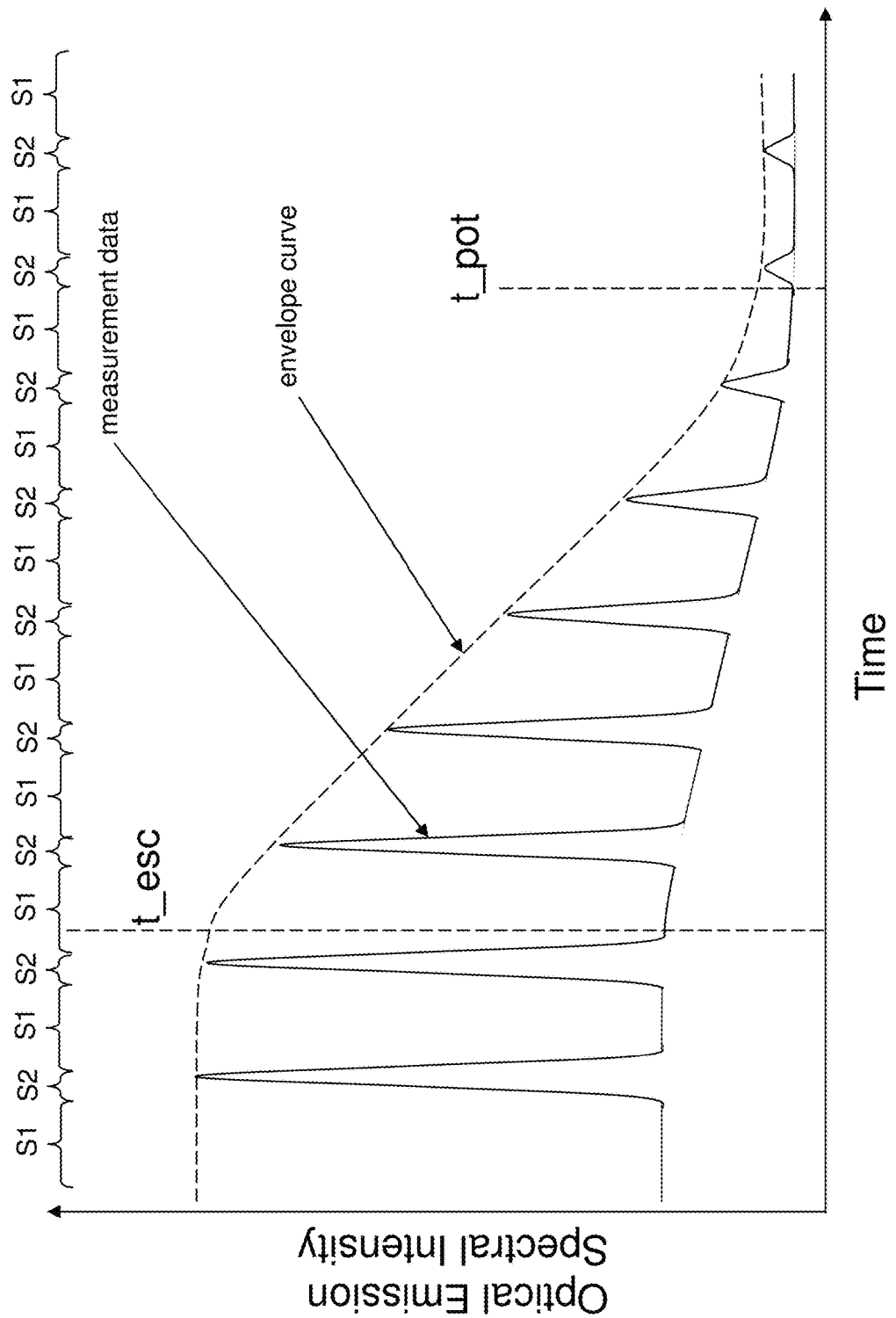
FIG. 9 is a schematic representation of an optical emission spectral intensity for the anisotropic etch process according to an embodiment of the present disclosure.

Referring to FIG. 9, the optical emission spectral intensity as a function of time is shown for the anisotropic etch process of the embodiment of the present disclosure, which includes a temporally alternating sequence of the normal-flow etch steps S1 and reduced-flow etch steps S2.

According to an aspect of the present disclosure, the controller 660 may be configured to collect optical emission spectrum intensity date of the plasma 632 detected by the spectrometer during the reduced-flow etch steps S2 as a function of time. The controller 660 may run a fitting program to generate an envelope curve from the measured values of the optical emission spectrum intensity of the plasma 632, and may run a termination time calculation program for determining the projected optimal termination time t_pot from the shape of the envelope curve as the function of time.

The fitting program may be configured to generate an envelope curve that fits the measurement data on the optical emission spectrum intensity of the plasma 632, to determine a projected optimal termination time t_pot for the anisotropic etch process based on a shape of the envelope curve as a function of time, and to terminate the anisotropic etch process at the projected optimal termination time t_pot. A projected optimal termination time refers to an ideal termination time for the anisotropic etch process as determined by a computer algorithm. The fitting program may employ and/or generate additional fitting parameters, which may include, for example, an endpoint signal commencement time t_esc, which is a time point at which a change in the optical emission spectral intensity can be detected for the first time, the slope of the envelope curve and/or the change of OES intensity between time t_esc and time t_pot.

Generally, the controller 660 may be configured to determine the projected optimal termination time t_pot employing correlation between previously measured depths of the openings through the at least one material layer (such as the etch mask 66 and/or the alternating stack (32, 42)) and previously measured optical emission spectral intensity profile as a function of time (and accompanying previously generated envelope curves) and previously employed termination time for the anisotropic etch process. In one embodiment, the controller is configured to determine the projected optimal termination time t_pot by calculating an intersect between the envelope curve and a constant-value line set at a predetermined percentage of a maximum value of the envelope curve. In another embodiment, the controller 660 is configured to determine the projected optimal termination time t_pot by calculating a time at which a slope of the envelope curve is at a predetermined value.

During the first anisotropic etch step, the carbon etch mask is etched using an oxygen containing plasma 632. During this step, an etchant gas comprising oxygen and argon is provided into the vacuum chamber 601 to generate the plasma 632. During the second anisotropic etch step, the alternating stack of insulating layers 32 comprising silicon oxide and sacrificial material layers 42 comprising silicon nitride are etched using reactive ion etching. In this case, the etchant gas of the anisotropic etch process may comprise $CF_4$, $CHF_3$, and/or $CCl_2F_2$.

For example, during the first anisotropic etch step, the oxygen flow rate may be reduced by 100 to 500 percent during the reduced-flow etch steps S2 relative to the normal-flow etch steps S1. This increases the OES intensity of the measured etch byproduct by at least two times, such as 2 to 3.5 times. For example, if the spectrometer 634 is set to measure CO intensity at 516 nm, the OES intensity difference between the CO signal and silicon oxide signal when the etch breaks through the etching mask 66 into the top silicon oxide layer of the alternating stack is increased by at least 3 times when the oxygen flow rate is reduced to 0.25 of the normal-flow etch rate.

Without wishing to be bound by a particular theory, it is believed that the OES intensity increases with lower etch gas flow rate for the following reason. The object of measurement of plasma optical emission analysis is the radiation accompanying the transition from the excited level to the low energy level. In this case, the emission wavelength $\lambda$ is obtained from the difference between the energy (Ei) at the upper level and the energy (Ej) at the lower level of the transition, where h as the plank constant and c as the speed of light, as provided in formula (1) below:

$$\lambda = hc/(Ei-Ej) \quad (1)$$

The difference between Ei and Ej is unique to the material, and in the end point detection of the etching process, the wavelength of the material that changes before and after etching is monitored, and the end point of etching is determined from the change in the emission intensity. Specifically, the information measured is the number density of excited species at the upper level of the succession involved in light emission. Since the density of luminescence-excited species Nex is determined by the balance between generation by electron collision excitation and extinction due to spontaneous emission or collision with other atoms/molecules, the velocity of Nex equation is expressed by the equation (2) below, where Teff' is the effective lifetime of the luminescent excited species:

$$dNex/dt = R - Nex/\tau eff \quad (2)$$

If i is designated to be the energy level of the emission-enhancing species, and j is designated to be the level of the transition destination due to spontaneous emission of photons, then in addition to i and j, there are usually levels that can be transitioned by spontaneous emission. The lifetime Trad of level i, which is determined by the transition due to spontaneous emission, is called the radiation lifetime and is expressed as the reciprocal of the sum of all spontaneous emission coefficients from i to the lower levels. τeff has a lifetime that considers non-emissive transitions to levels other than i caused by collisions with other atoms/molecules in addition to transitions due to spontaneous emission. It is expressed by equation (3) below using the degree coefficients Kq and τrad:

$$\tau eff = 1/(\tau \text{ rad } -1 + NgasKq) \quad (3)$$

At equilibrium, d Nex/dt=0 holds in equation (2), and the density of luminescent excited species is N=τR. Therefore, the emission line spectrum intensity is expressed by the following equation (4):

$$I = ChvijAijNex = ChvijAij\tau effR \quad (4)$$

In formula (4), Aij is the spontaneous emission coefficient of the transition from the level i to j, h is the energy of the photons emitted by the transition, and C is a constant determined by the emission measurement system.

Referring collectively to FIGS. 4, 5, 7, 8 and 9, an etching method includes etching a material in an etch chamber 600 by alternating normal-flow etch steps S1 and reduced-flow etch steps S2, where an etchant gas is provided at a normal flow rate into the etch chamber during the normal-flow etch steps, and the etchant gas is provided at a reduced flow rate lower than the normal flow rate into the etch chamber during the reduced-flow etch steps, obtaining optical emission spectroscopy (OES) data during the reduced-flow etch steps, determining an end point for the etching based on the obtained OES data, and ending the etching at the determined end point.

In one embodiment, the method also includes providing a stack including a substrate (9, 10), at least one material layer (32, 42), a blanket etch mask layer 66', such as a carbon etch mask layer, and a patterned photoresist layer 68 in an etch chamber 600 of an etch apparatus 1000; and transferring a pattern in the patterned photoresist layer 68 through the blanket etch mask layer 66' to form a patterned etch mask layer 66 and transferring a pattern in the patterned etch mask layer 66 through the at least one material layer (32, 42) by supplying the etchant gas into the etch chamber 600 and by generating a plasma 632 of the etchant gas within the etch chamber 600.

In one embodiment, the etching comprises an anisotropic etch process; and the step of obtaining the OES data comprises measuring an optical emission spectrum intensity of the plasma 632 during the reduced-flow etch steps S2 as a function of time.

In one embodiment, an envelope curve that fits measured values of the optical emission spectrum intensity of the plasma 632 is generated. A projected optimal termination time t_pot of the end point of the anisotropic etch process can be determined based on a shape of the envelope curve as a function of time, and terminating the anisotropic etch process at the projected optimal termination time t_pot.

In one embodiment, the reduced flow rate is in a range from 5% to 50% of the reference flow rate. In one embodiment, an average duration of the reduced-flow etch steps S2 is in a range from 1% to 25% of an average duration of the normal-flow etch steps S1 other than a last normal-flow etch step. In one embodiment, the anisotropic etch process comprises at least 3 reduced-flow etch steps S2 and at least 4 normal-flow etch steps S1; and a last normal-flow etch step within the anisotropic etch process has a shorter duration than any other normal-flow etch step within the anisotropic etch process, for example, by terminating the anisotropic etch process at the projected optimal termination time t_pot.

In one embodiment, the etchant gas, the reference flow rate, and the reduced flow rate are selected such that the optical emission spectrum intensity of the plasma 632 increases during the reduced-flow etch steps S2 relative to the normal-flow etch steps S1. In one embodiment, a partial pressure of the etchant gas during the reduced-flow etch steps S2 is in a range from 5% to 50% of a partial pressure of the etchant gas during the normal-flow etch steps S1.

Figure 10A:
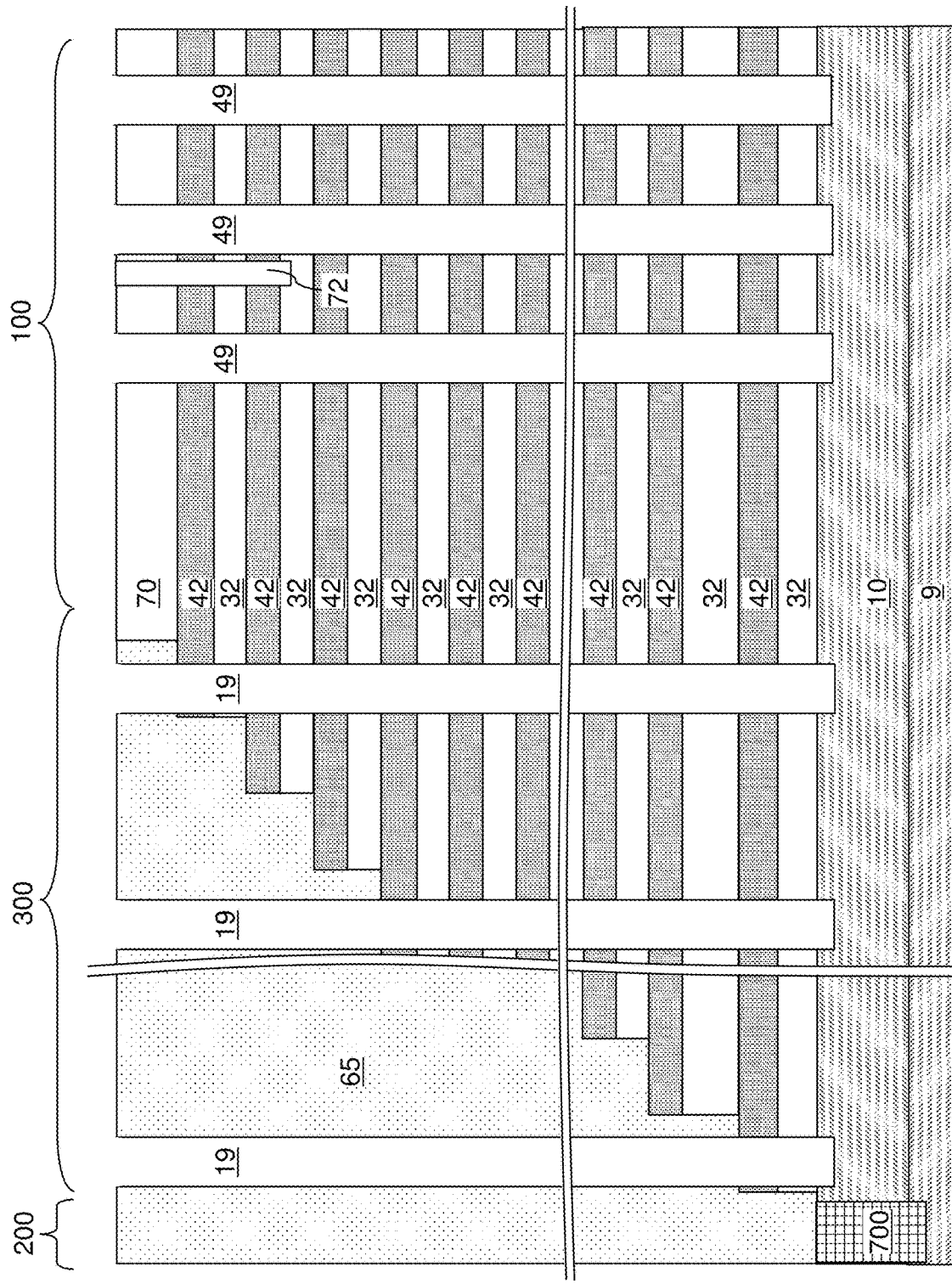
FIG. 10A is a schematic vertical cross-sectional view of the exemplary structure after formation of memory openings and support openings according to an embodiment of the present disclosure.
Figure 10B:
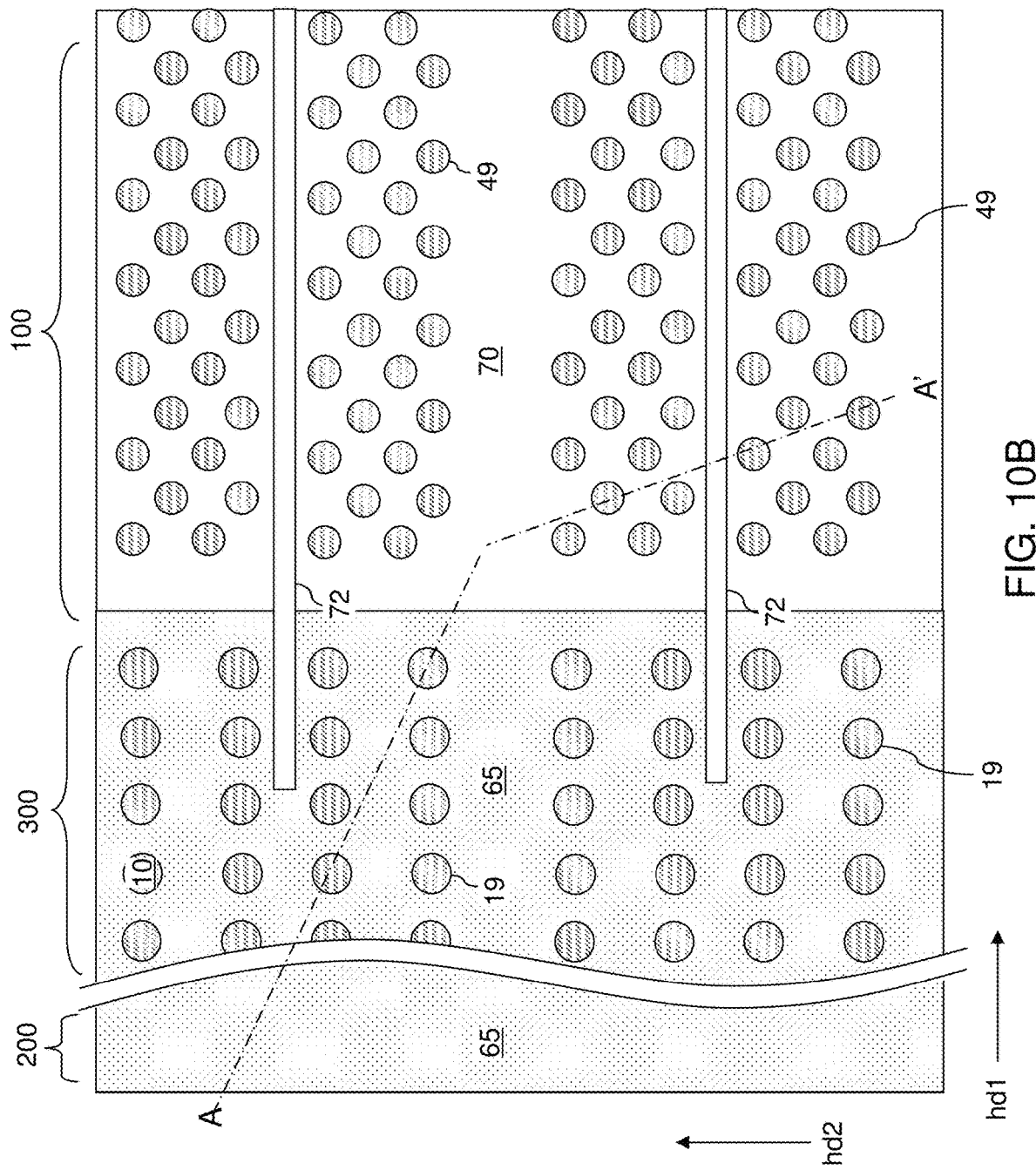
FIG. 10B is a top-down view of the exemplary structure of FIG. 10A. The vertical plane A-A' is the plane of the cross-section for FIG. 10A.

Referring to FIGS. 10A and 10B, the exemplary structure is illustrated after the processing steps of FIG. 5, which can be performed employing the etch apparatus 1000 illustrated in FIG. 7 and employing an anisotropic etch process employing the process conditions described with reference to FIGS. 8 and 9.

In the exemplary structure, portions of the alternating stack (32, 42) underlying the openings in the patterned etch mask layer 66 are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Subsequently, a series of processing steps can be performed to form a memory opening fill structure in each memory opening and to form a support pillar structure in each support opening. FIGS. 11A-11H are sequential schematic vertical cross-sectional views of a memory opening 49 within the exemplary structure during formation of a memory stack structure, an optional dielectric core, and a drain region therein according to an embodiment of the present disclosure.

Referring to FIG. 11A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 11B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 11D:
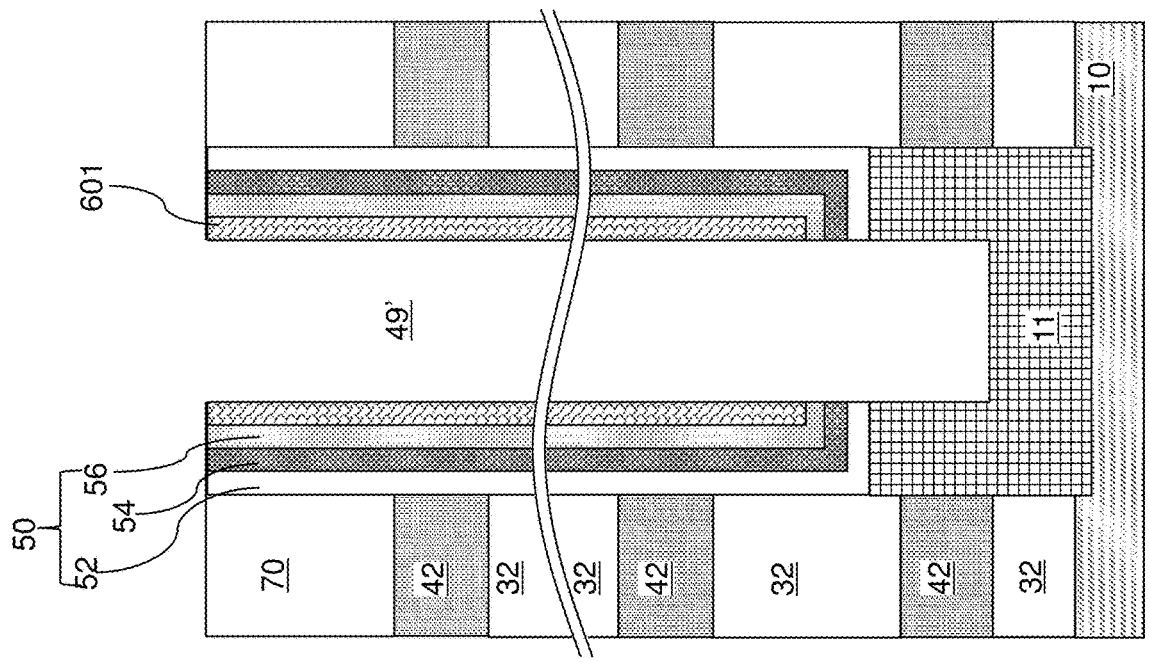
Figure 11C:
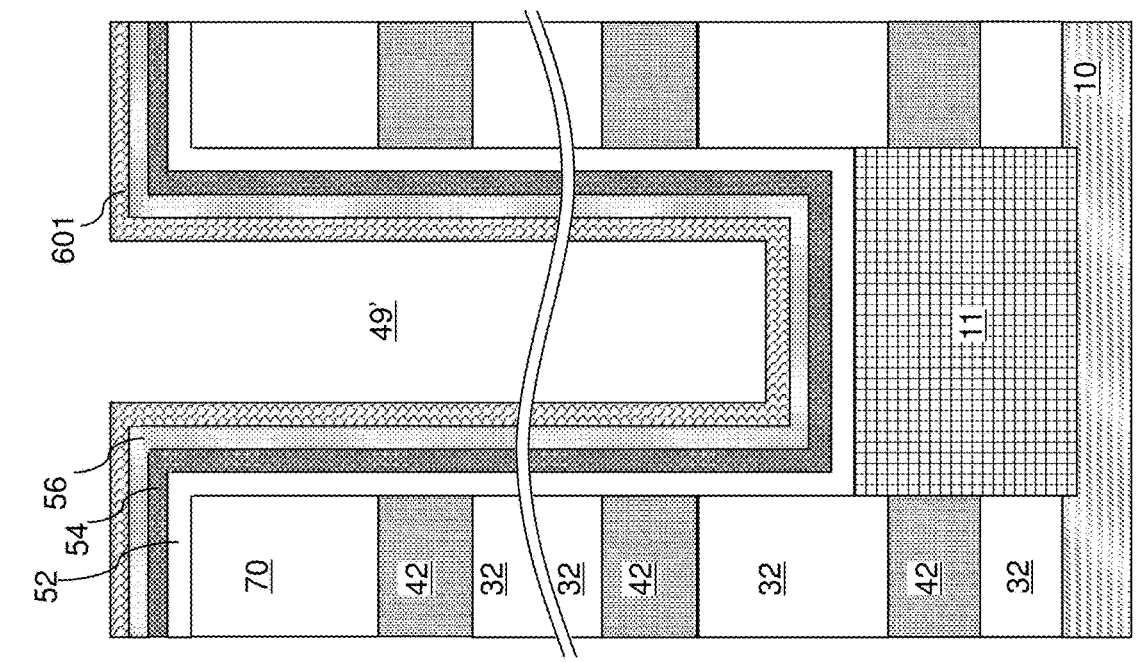

Referring to FIG. 11C, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 11D, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which includes a plurality of charge storage regions (as embodied as the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Figure 11E:
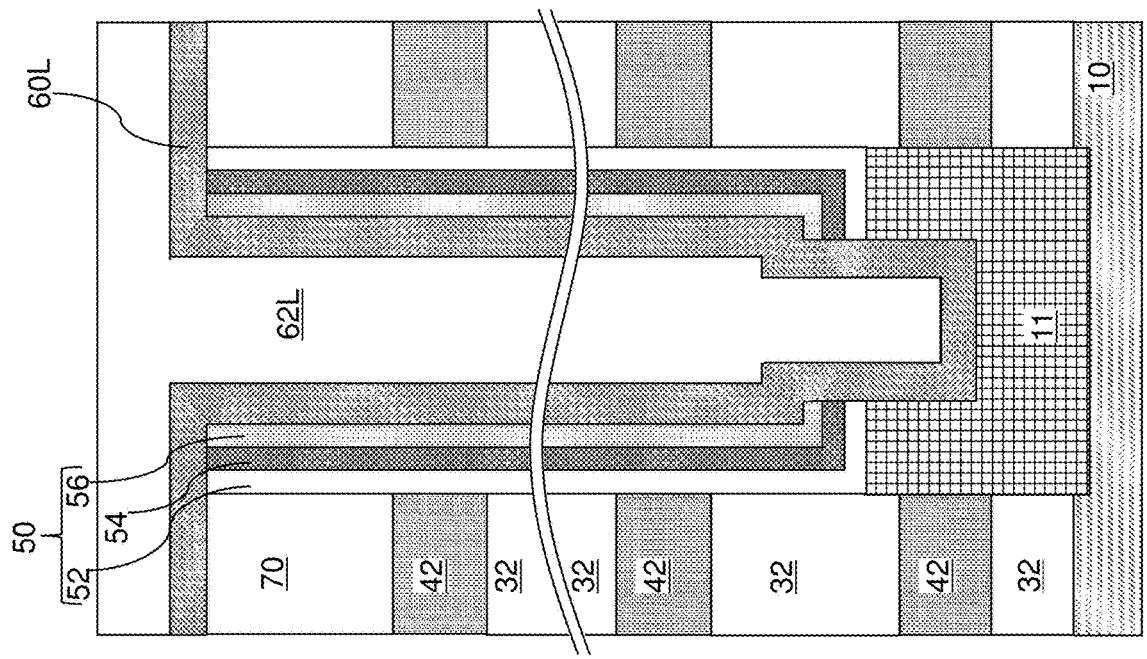

Referring to FIG. 11E, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figure 11F:
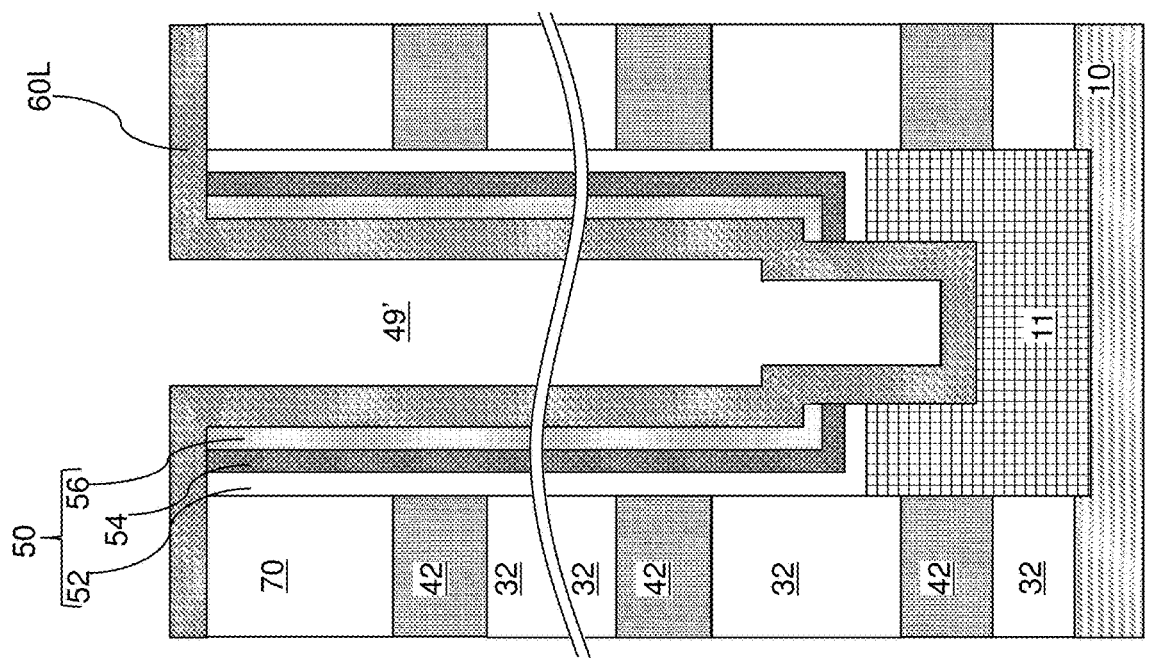

Referring to FIG. 11F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 11G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 11H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{-19}/cm^3$ to $2.0 \times 10^{-21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 12:
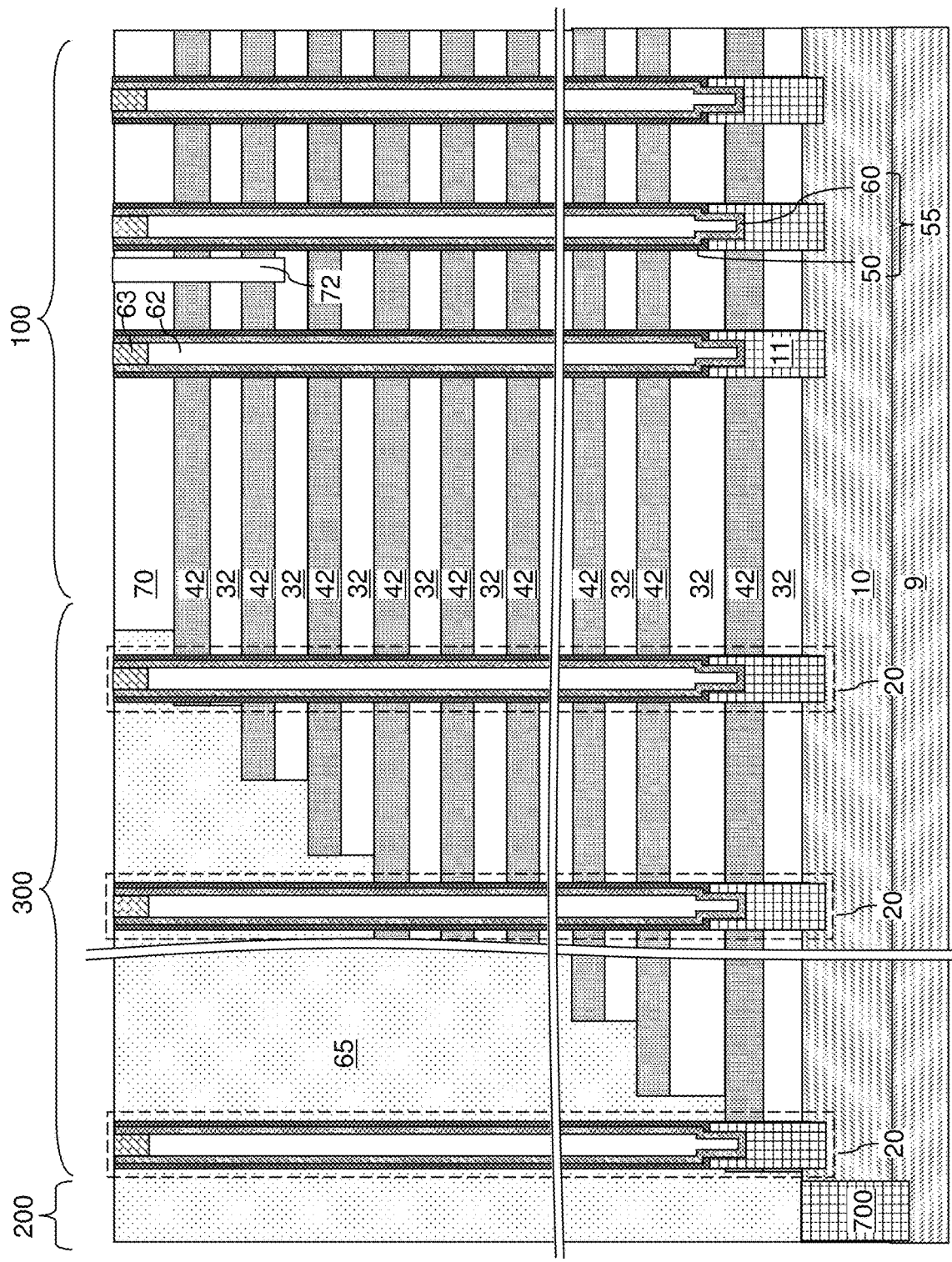
FIG. 12 is a schematic vertical cross-sectional view of the exemplary structure after formation of memory stack structures and support pillar structures according to an embodiment of the present disclosure.

Referring to FIG. 12, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions or ferroelectric regions (e.g., comprising portions of the memory material layer 54) laterally surrounding the tunneling dielectric layer 56 (if present in combination with the charge storage regions) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 13A:
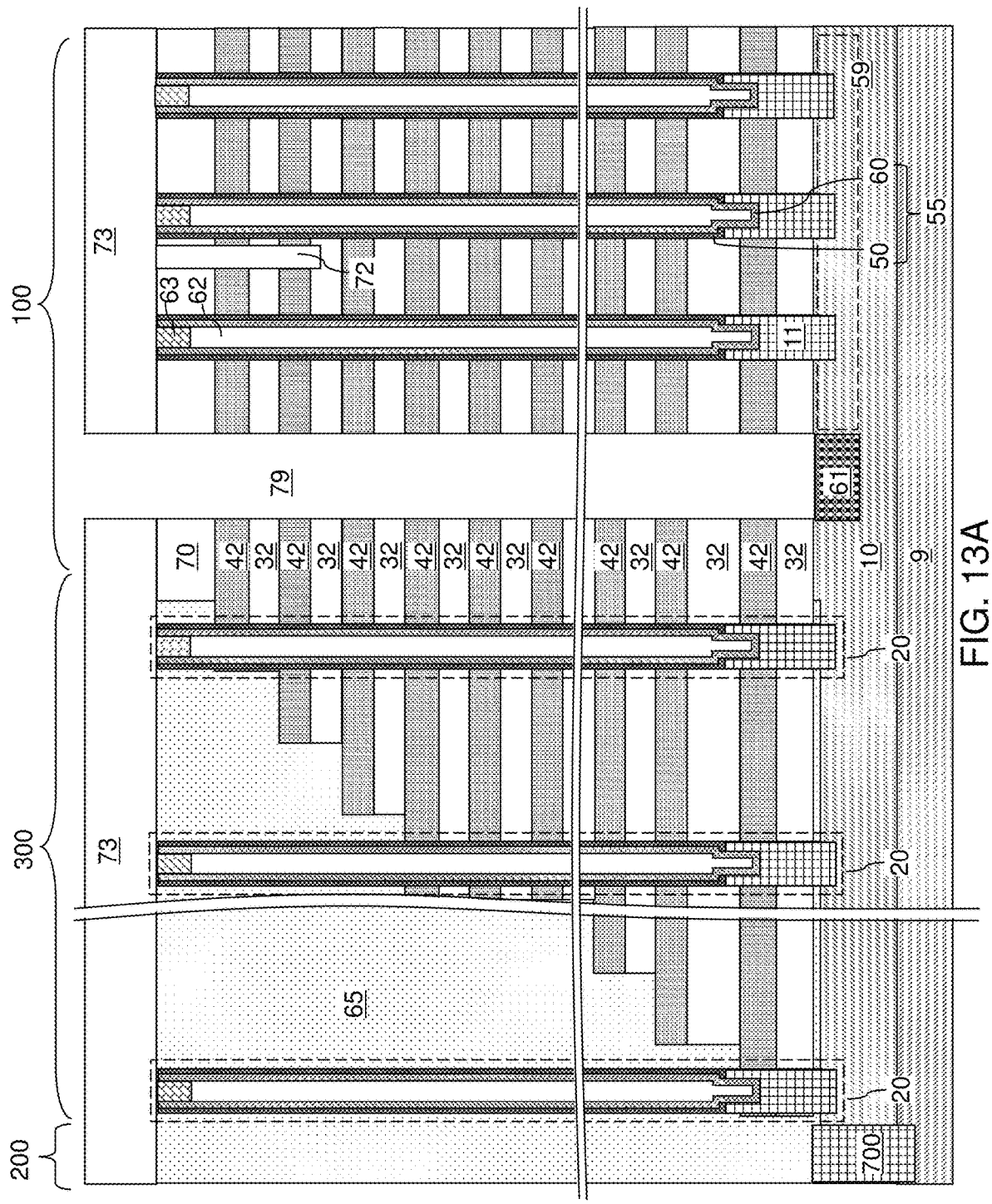
FIG. 13A is a schematic vertical cross-sectional view of the exemplary structure after formation of backside trenches and source regions according to an embodiment of the present disclosure.
Figure 13B:
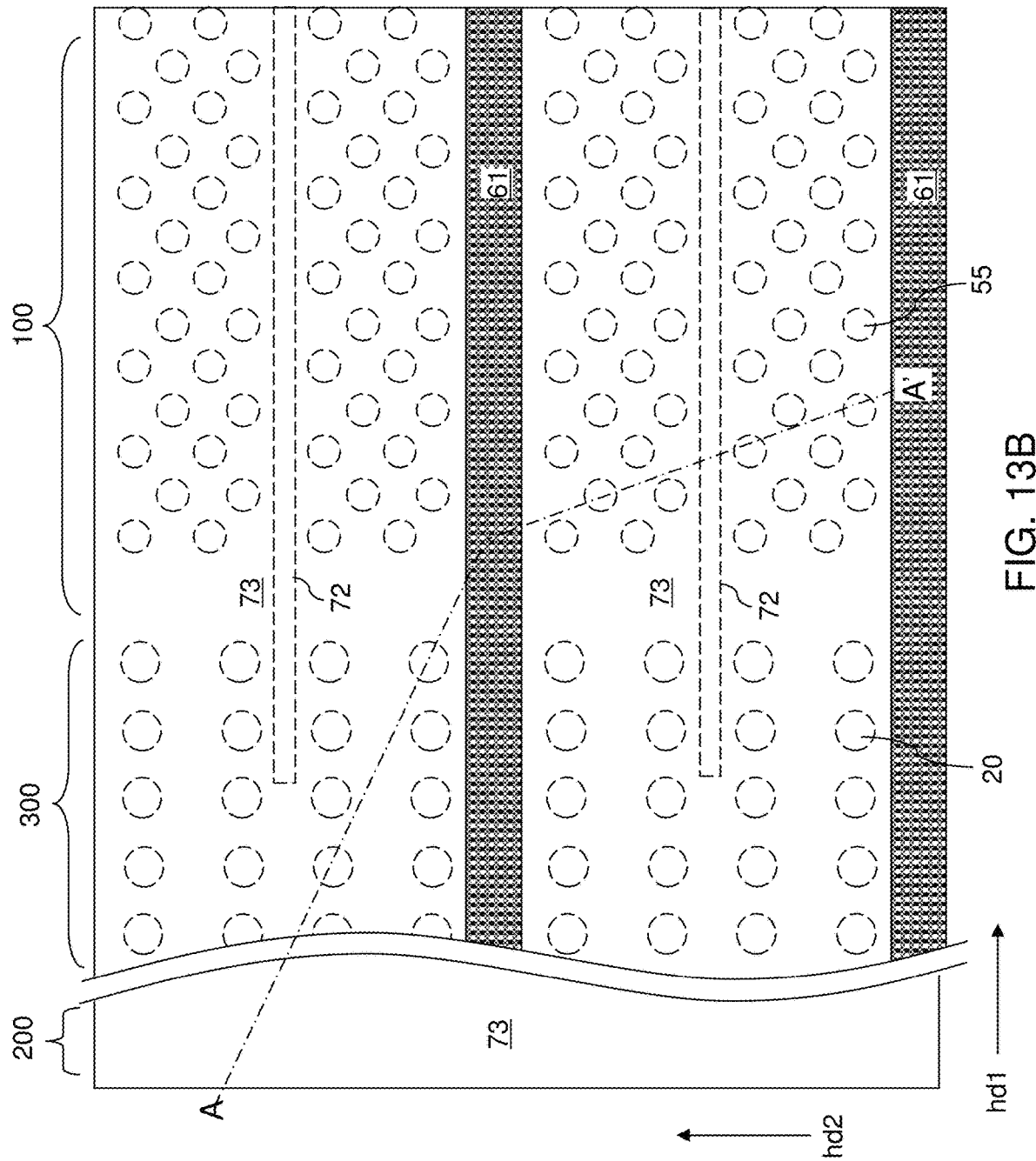
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 14:
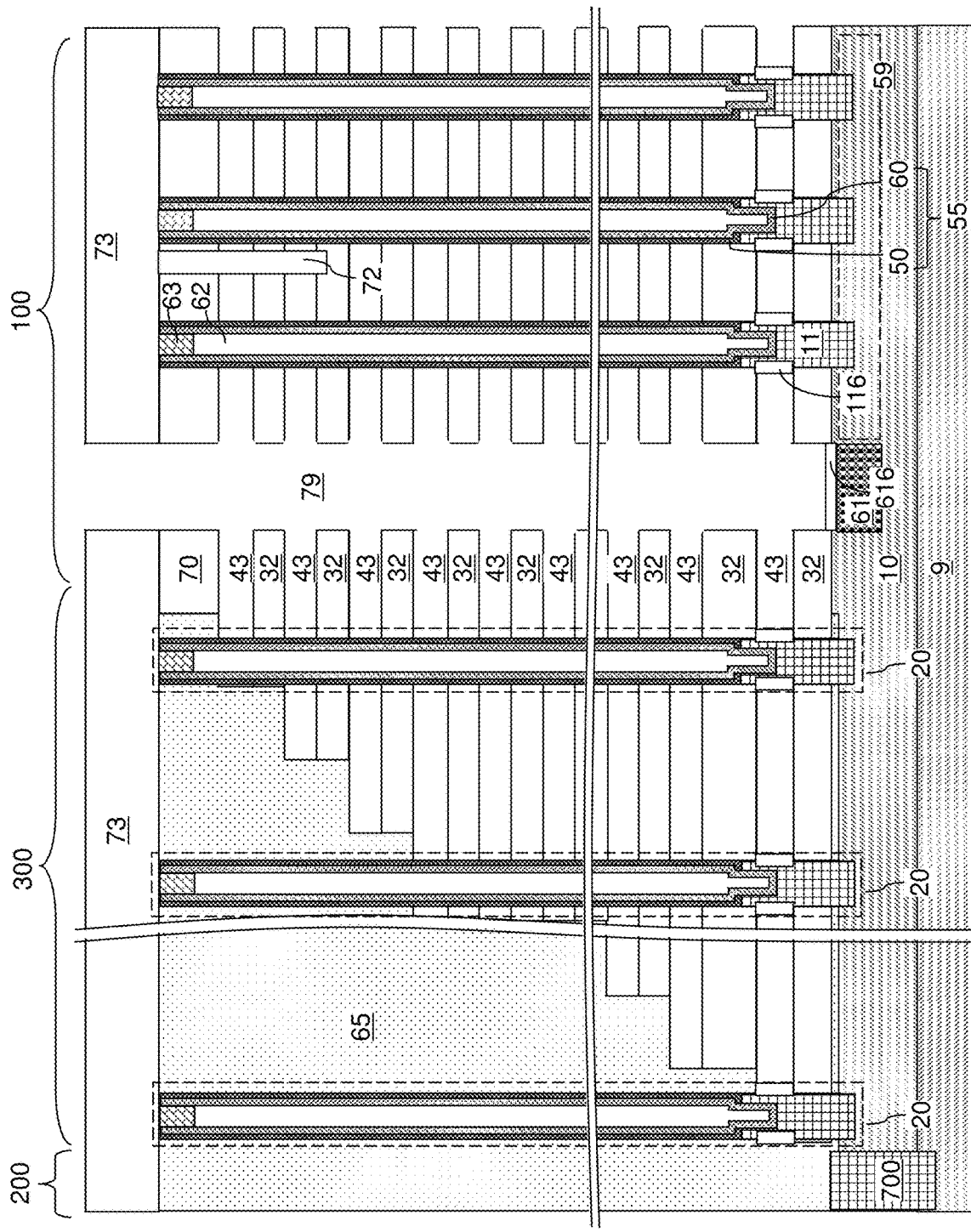
FIG. 14 is a schematic vertical cross-sectional view of the exemplary structure after formation of backside recesses according to an embodiment of the present disclosure.

Referring to FIGS. 14 and 15A, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figures 15C, 15D:
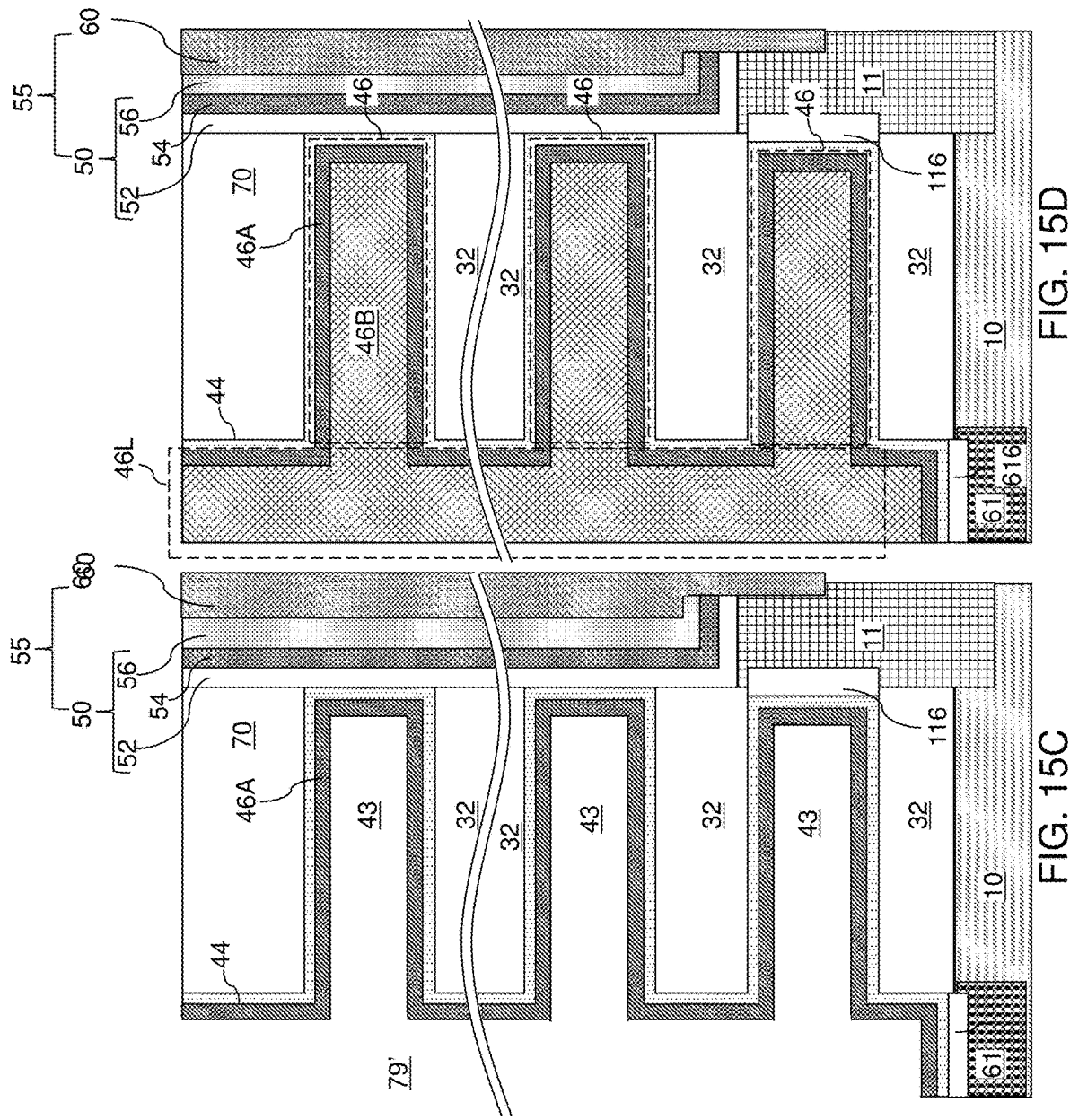

Referring to FIG. 15C, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 16:
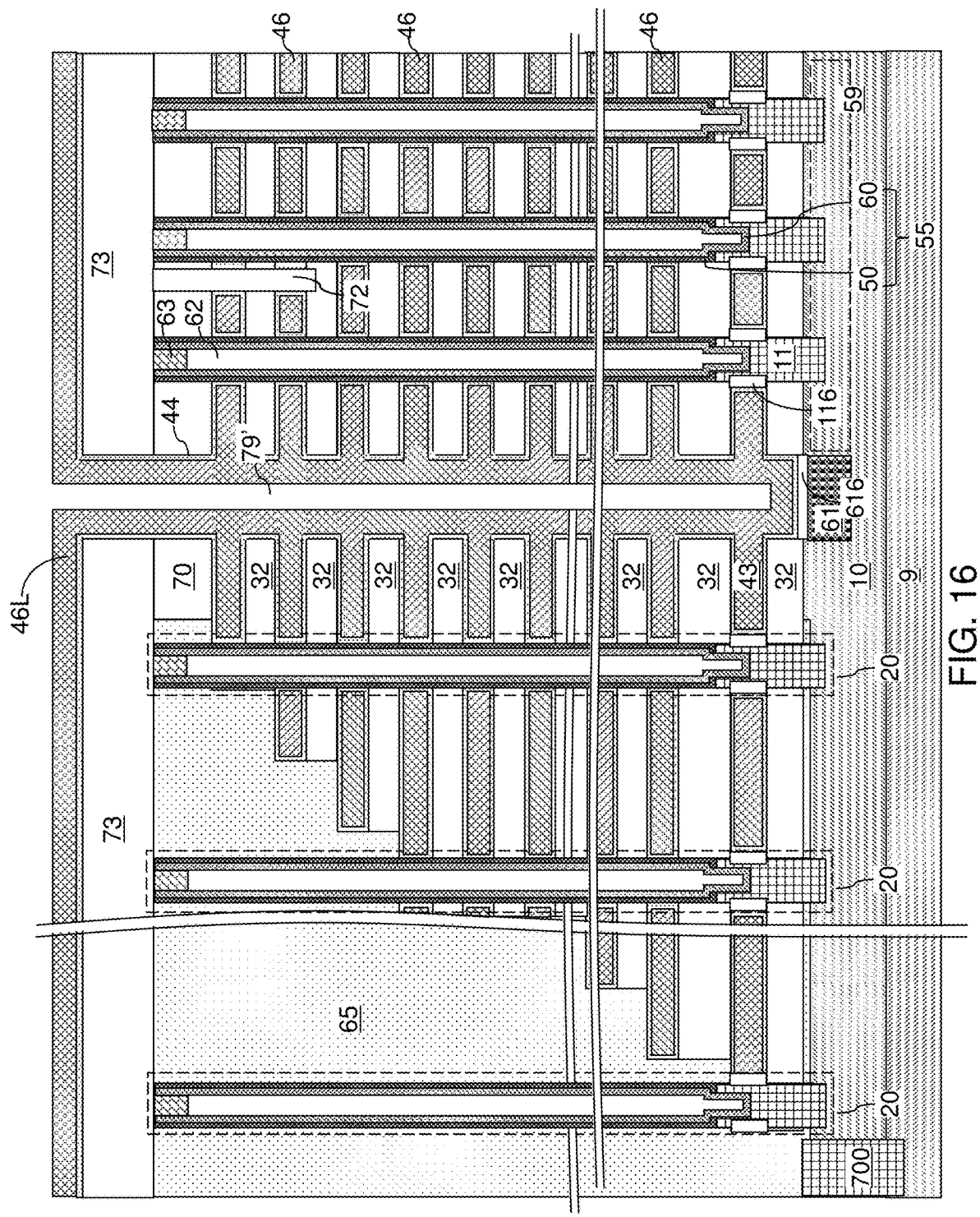
FIG. 16 is a schematic vertical cross-sectional view of the exemplary structure at the processing step of FIG. 15D.

Referring to FIGS. 15D and 16, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 17A:
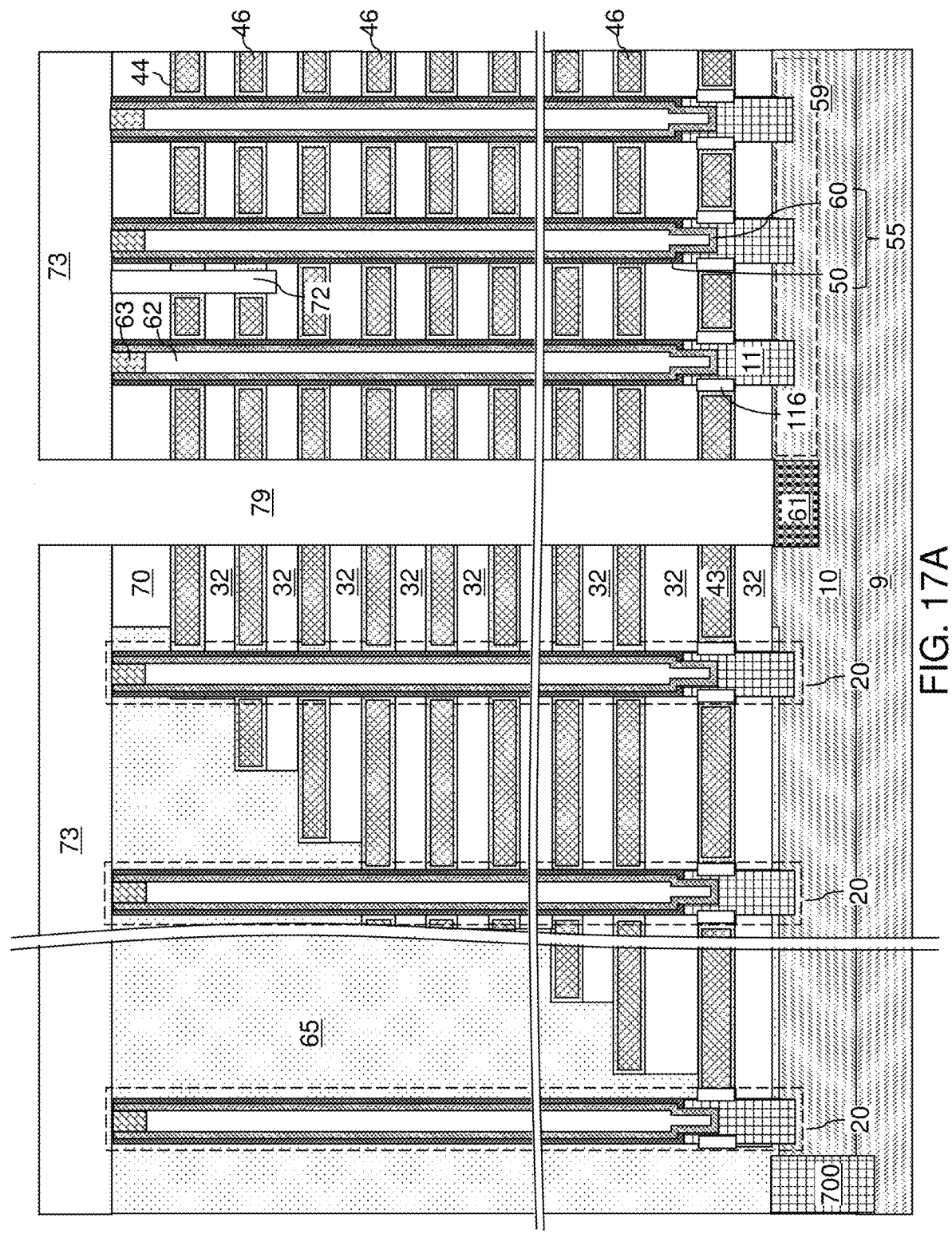
FIG. 17A is a schematic vertical cross-sectional view of the exemplary structure after removal of conductive materials from within the backside trenches according to an embodiment of the present disclosure.
Figure 17B:
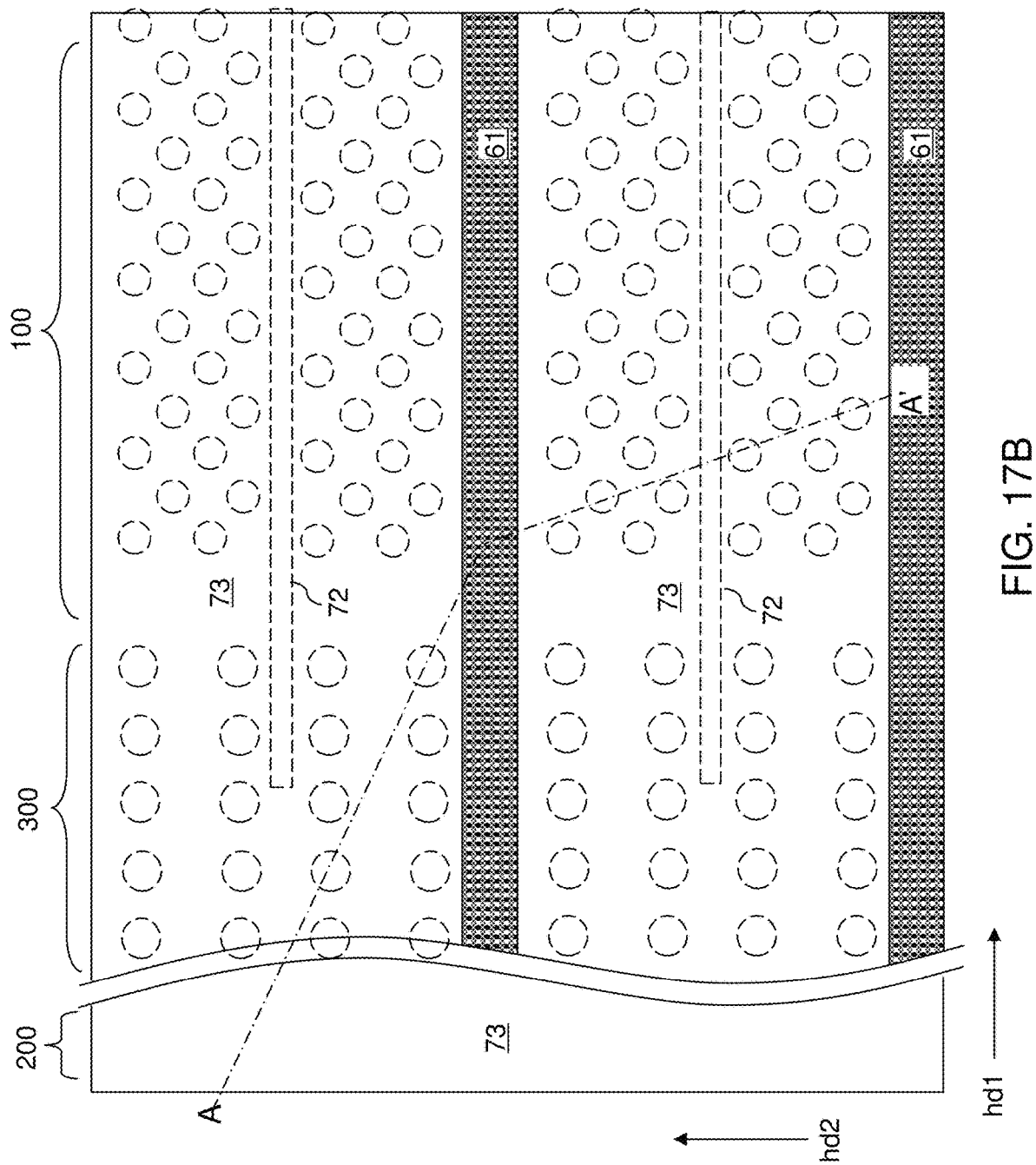
FIG. 17B is a partial see-through top-down view of the exemplary structure of FIG. 17A. The vertical plane A-A' is the plane of the schematic vertical cross-sectional view of FIG. 17A.

Referring to FIGS. 17A and 17B, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79. Each backside cavity continuous extends along the first horizontal direction hd1.

Figure 18A:
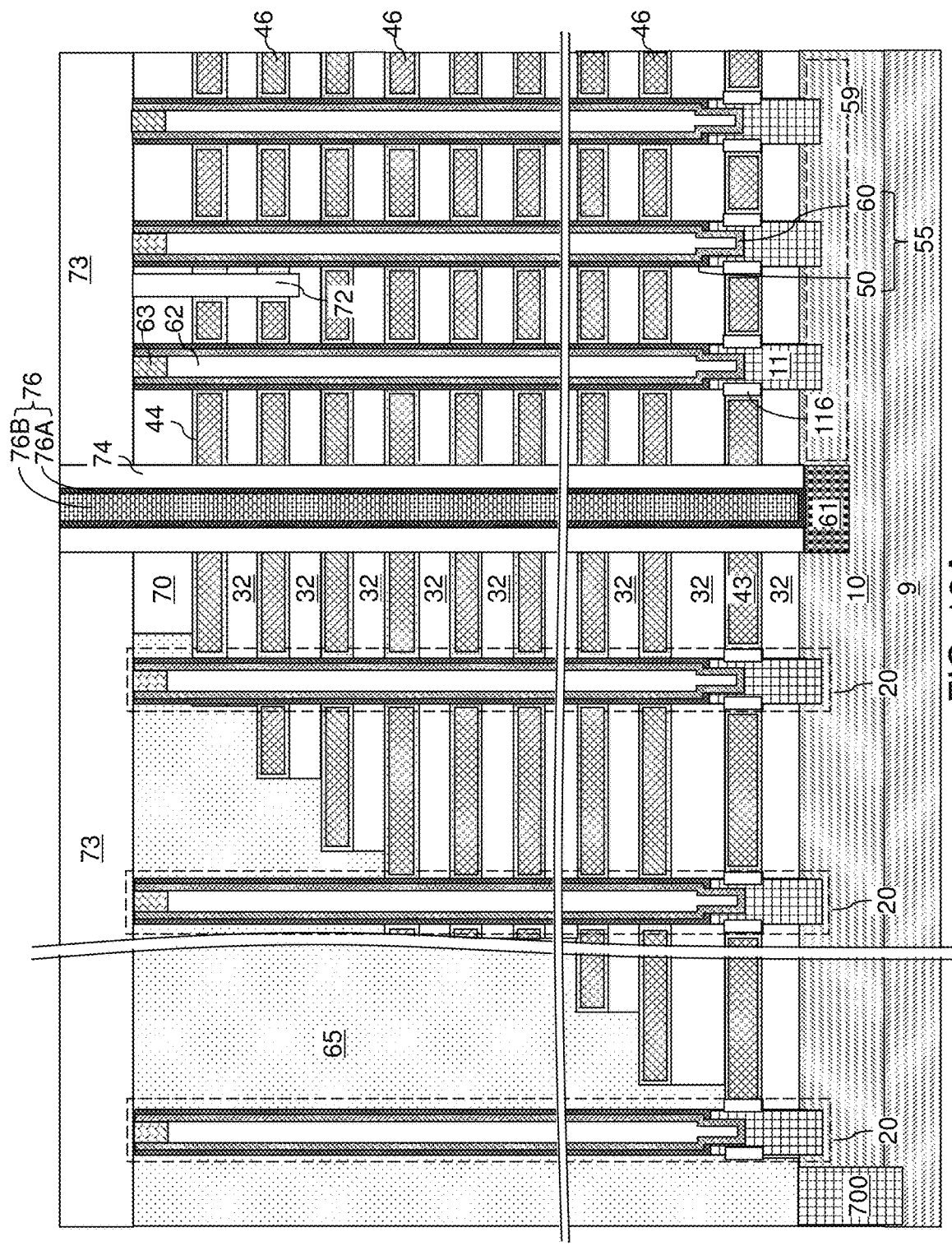
FIG. 18A is a schematic vertical cross-sectional view of the exemplary structure after formation of insulating spacers and backside contact via structures according to an embodiment of the present disclosure.
Figure 18B:
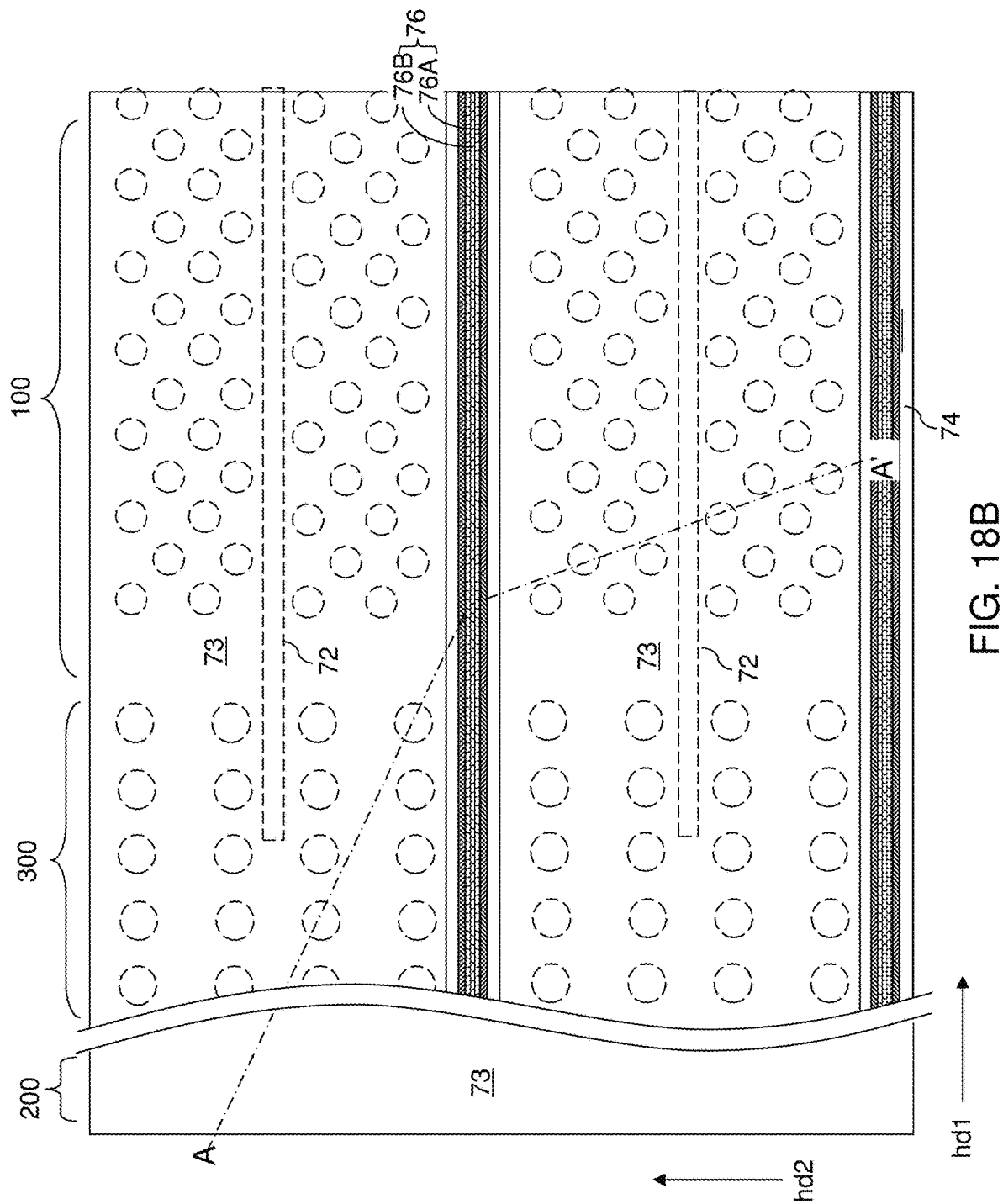
FIG. 18B is a partial see-through top-down view of the exemplary structure of FIG. 18A. The vertical plane A-A' is the plane of the schematic vertical cross-sectional view of FIG. 18A.

Referring to FIGS. 18A and 18B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 19A:
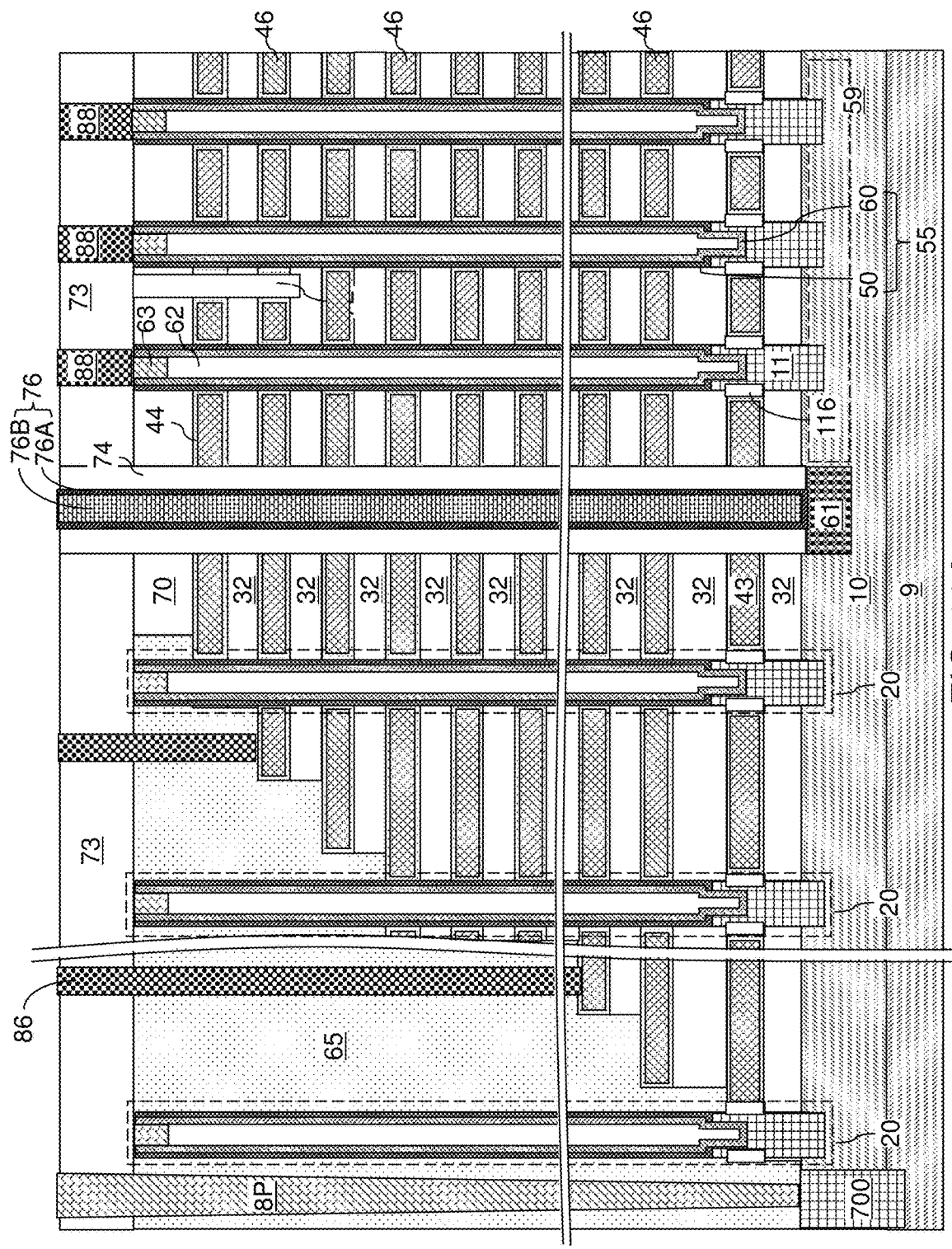
FIG. 19A is a schematic vertical cross-sectional view of the exemplary structure after formation of additional contact via structures according to an embodiment of the present disclosure.
Figure 19B:
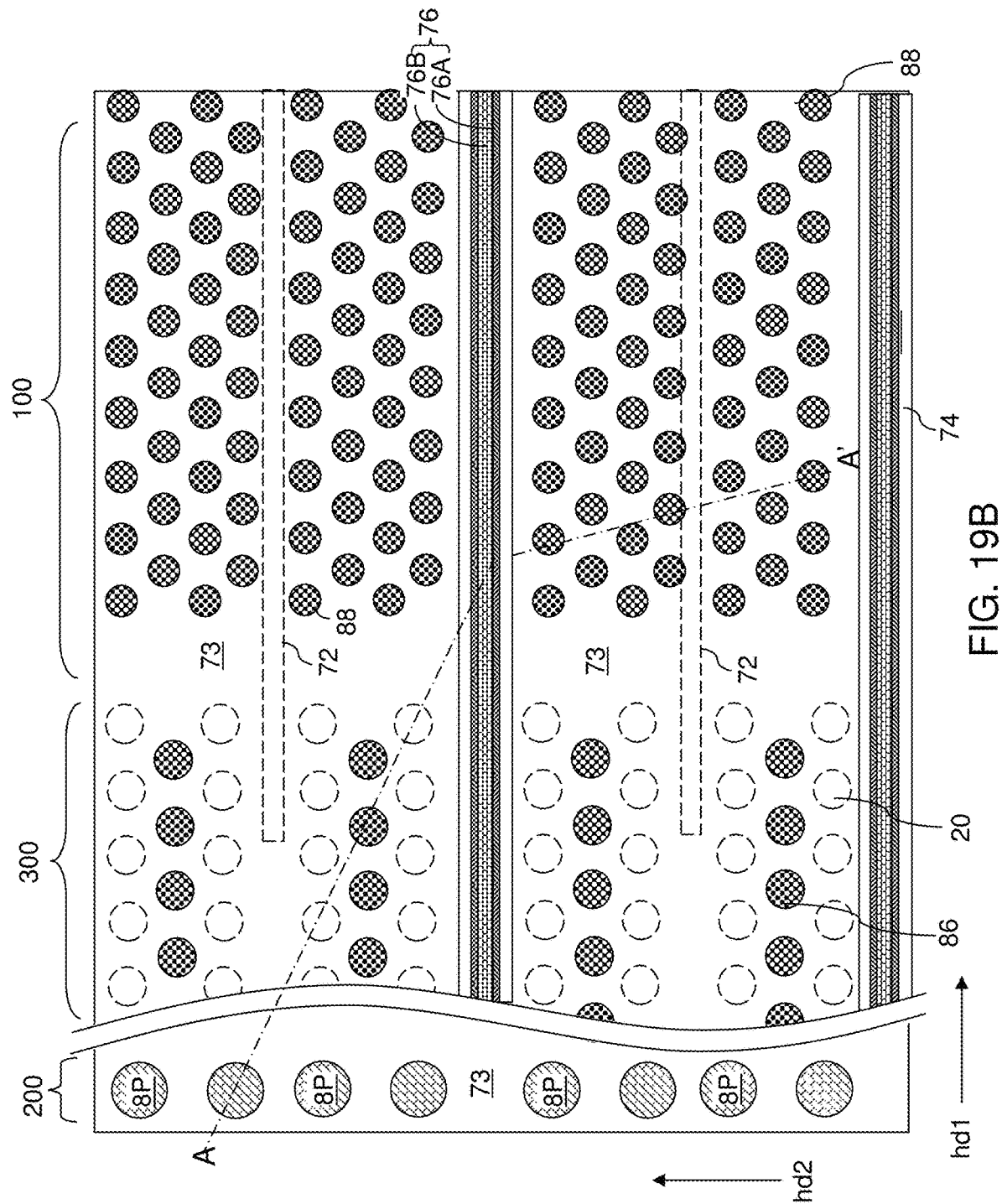
FIG. 19B is a top-down view of the exemplary structure of FIG. 19A. The vertical plane A-A' is the plane of the schematic vertical cross-sectional view of FIG. 19A.

Referring to FIGS. 19A and 19B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

The various embodiments of the present disclosure can be employed to enhance the controllability of the recess depth of openings formed through a thick layer stack such as the memory openings 49 and the support openings 19 that are formed through an alternating stack of insulating layers 32 and sacrificial material layers 42. Precise control of the depths of the memory openings 49 can decrease the variability of the geometry of the structural components within the memory opening fill structures 58, such as the locations, the dimensions, and the taper angles of the memory films 50, the vertical semiconductor channels 60, etc. Thus, the various embodiments of the present disclosure may be employed to increase process yield and to reduce the performance variability of various semiconductor devices including, but not limited to, three-dimensional memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. An etching method, comprising:
    providing a stack including a substrate, at least one material layer, a blanket etch mask layer, and a patterned photoresist layer in an etch chamber of an etch apparatus;
    transferring a pattern in the patterned photoresist layer through the blanket etch mask layer to form a patterned etch mask layer;
    transferring a pattern in the patterned etch mask layer through the at least one material layer by supplying an etchant gas into the etch chamber and by generating a plasma of the etchant gas within the etch chamber to etch the at least one material layer in the etch chamber by alternating normal-flow etch steps and reduced-flow etch steps, wherein the etchant gas is provided at a normal flow rate into the etch chamber during the normal-flow etch steps, and the etchant gas is provided at a reduced flow rate lower than the normal flow rate into the etch chamber during the reduced-flow etch steps;
    obtaining optical emission spectroscopy (OES) data during the reduced-flow etch steps;
    determining an end point for the etching based on the obtained OES data; and
    ending the etching at the determined end point;
    wherein:
    the etching comprises an anisotropic etch process; and
    the step of obtaining the OES data comprises measuring an optical emission spectrum intensity of the plasma during the reduced-flow etch steps as a function of time; and
    further comprising generating an envelope curve that fits measured values of the optical emission spectrum intensity of the plasma, determining a projected optimal termination time of the end point of the anisotropic etch process based on a shape of the envelope curve as a function of time, and ending the anisotropic etch process at the projected optimal termination time.

2. The method of claim 1, wherein the projected optimal termination time is determined by calculating an intersect between the envelope curve and a constant-value line set at a predetermined percentage of a maximum value of the envelope curve.

3. The method of claim 1, wherein the projected optimal termination time is determined by calculating a time at which a slope of the envelope curve is at a predetermined value.

4. The method of claim 1, wherein the etchant gas, the reference flow rate, and the reduced flow rate are selected such that the optical emission spectrum intensity of the plasma increases during the reduced-flow etch steps relative to the normal-flow etch steps.

5. The method of claim 1, wherein the material comprises the blanket etch mask layer which comprises a carbon-based material layer including carbon at an atomic percentage of at least 90% and having a thickness of at least 1.5 microns.

6. The method of claim 5, wherein the at least one material layer comprises an alternating stack of insulating layers and sacrificial material layers and having a total thickness of at least 4 microns.

7. The method of claim 6, wherein the anisotropic etch process etches a memory opening through the alternating stack.

8. The method of claim 7, further comprising:
    forming a memory opening fill structure comprising a memory film and vertical semiconductor channel in the memory opening; and
    replacing the sacrificial material layers with electrically conductive layers to form a three-dimensional memory device.

9. The method of claim 1, wherein:
    the reduced flow rate is in a range from 5% to 50% of the reference flow rate; and
    an average duration of the reduced-flow etch steps is in a range from 1% to 25% of an average duration of the normal-flow etch steps other than a last normal-flow etch step.

10. The method of claim 1, wherein a partial pressure of the etchant gas during the reduced-flow etch steps is in a range from 5% to 50% of a partial pressure of the etchant gas during the normal-flow etch steps.

11. The method of claim 1, wherein the material comprises a carbon etch mask layer.

* * * * *